US012660187B2

(12) United States Patent
Koh et al.

(10) Patent No.: US 12,660,187 B2
(45) Date of Patent: Jun. 16, 2026

(54) SEMICONDUCTOR MEMORY DEVICES AND ELECTRONIC SYSTEMS INCLUDING THE SAME

(71) Applicant: SAMSUNG ELECTRONICS CO., LTD., Suwon-si (KR)

(72) Inventors: Beyong Hyun Koh, Suwon-si (KR); Ho Jin Kim, Suwon-si (KR); Geun Won Lim, Suwon-si (KR); Jung Ho Lee, Suwon-si (KR); Hyun Gun Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 496 days.

(21) Appl. No.: 18/450,969

(22) Filed: Aug. 16, 2023

(65) Prior Publication Data

US 2024/0130127 A1　　Apr. 18, 2024

(30) Foreign Application Priority Data

Oct. 12, 2022　(KR) ........................ 10-2022-0130579
Mar. 7, 2023　(KR) ........................ 10-2023-0029843

(51) Int. Cl.
| | |
|---|---|
| *H10B 43/27* | (2023.01) |
| *G11C 5/06* | (2006.01) |
| *G11C 16/04* | (2006.01) |
| *H10B 43/10* | (2023.01) |
| *H10B 43/35* | (2023.01) |
| *H10D 62/13* | (2025.01) |
| *H10W 20/41* | (2026.01) |

(52) U.S. Cl.
CPC ............. *H10B 43/27* (2023.02); *G11C 5/063* (2013.01); *G11C 16/0483* (2013.01); *H10B 43/10* (2023.02); *H10B 43/35* (2023.02); *H10D 62/151* (2025.01); *H10W 20/435* (2026.01)

(58) Field of Classification Search
CPC ........ H10B 43/27; H10B 43/10; H10B 43/35; G11C 5/063; G11C 16/0483; H10D 62/151; H10W 20/435
See application file for complete search history.

(56) References Cited

U.S. PATENT DOCUMENTS

| | | | |
|---|---|---|---|
| 8,853,818 | B2 | 10/2014 | Lue |
| 10,658,377 | B2 | 5/2020 | Kubo et al. |

(Continued)

*Primary Examiner* — William B Partridge
*Assistant Examiner* — Chevy J Boegel
(74) *Attorney, Agent, or Firm* — Wolf, Greenfield & Sacks, P.C.

(57) ABSTRACT

A semiconductor memory device comprises a substrate; a mold structure on the substrate; a plurality of channel structures extending in the mold structure; a source layer and a source sacrificial layer between the substrate and the mold structure, wherein the source sacrificial layer is spaced apart from the source layer; and a source support layer on the source layer and the source sacrificial layer, wherein the source support layer is between the source layer and the source sacrificial layer, wherein an upper surface of the source support layer includes first and second portions extending parallel to the substrate, and a third portion that connects the first and second portions, wherein a vertical distance from an upper surface of the source layer to the first portion is smaller than a vertical distance from an upper surface of the substrate to the second portion.

20 Claims, 29 Drawing Sheets

(56) References Cited

U.S. PATENT DOCUMENTS

| | | | |
|---|---|---|---|
| 10,818,678 B2 | 10/2020 | Hwang et al. | |
| 11,121,148 B2 | 9/2021 | Kim et al. | |
| 11,380,700 B2 * | 7/2022 | Kim | H10B 41/27 |
| 2012/0108048 A1 | 5/2012 | Lim et al. | |
| 2022/0173118 A1 * | 6/2022 | Kang | H10B 43/27 |

* cited by examiner

SEMICONDUCTOR MEMORY DEVICES AND ELECTRONIC SYSTEMS INCLUDING THE SAME

CROSS-REFERENCE TO RELATED APPLICATIONS

This application claims priority to Korean Patent Application Nos. 10-2022-0130579 filed on Oct. 12, 2022, and No. 10-2023-0029843 filed on Mar. 7, 2023 in the Korean Intellectual Property Office, and all the benefits accruing therefrom under 35 U.S.C. 119, the contents of which in its entirety are herein incorporated by reference.

BACKGROUND

The present disclosure relates to semiconductor memory devices having improved reliability and electronic systems including the same.

There is a demand for increasing the degree of integration of a non-volatile memory device to satisfy performance and price required by consumers. In the case of the non-volatile memory device, because the degree of integration thereof may be an important factor in determining the price of products, an increased degree of integration may be required.

On the other hand, in the case of a two-dimensional or planar semiconductor device, the degree of integration thereof may be determined by an area occupied by a unit memory cell and is therefore affected by the level of fine pattern forming technology. However, since expensive apparatuses may be required to miniaturize the pattern, the degree of integration of the two-dimensional non-volatile memory device is increasing but is still limited.

Accordingly, three-dimensional non-volatile memory devices including memory cells arranged three-dimensionally have been proposed.

SUMMARY

Aspects of the present disclosure provide semiconductor memory devices having improved reliability.

Aspects of the present disclosure also provide electronic systems including the semiconductor memory devices having improved reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to some embodiments of the present disclosure, a semiconductor memory device comprising: a substrate, wherein the substrate includes a cell array region, an extension region, and a boundary region between the cell array region and the extension region; a mold structure on the substrate, wherein the mold structure includes a plurality of gate electrodes stacked alternately with a plurality of mold insulating films, and wherein the plurality of gate electrodes includes a step profile in a cross-sectional view in the extension region; a plurality of channel structures, wherein the plurality of channel structures extends in the mold structure in the cell array region; a plurality of dummy channel structures, wherein the plurality of dummy channel structures extends in the mold structure in the boundary region; a plurality of cell contacts electrically connected to the plurality of gate electrodes in the extension region; a source layer between the substrate and the mold structure, wherein the source layer is electrically connected to the plurality of channel structures in the cell array region; a source sacrificial layer between the substrate and the mold structure in the extension region, wherein the source sacrificial layer is spaced apart from the source layer; and a source support layer on the source layer and the source sacrificial layer, wherein the source support layer is between the source layer and the source sacrificial layer, wherein an upper surface of the source support layer includes a first portion extending parallel to an upper surface of the substrate, a second portion extending parallel to the upper surface of the substrate, and a third portion that connects the first portion and the second portion, wherein the first portion is spaced apart from the second portion, and wherein a first vertical distance from an upper surface of the source layer to the first portion is smaller than a second vertical distance from the upper surface of the substrate to the second portion.

According some embodiments of the present disclosure, a semiconductor memory device comprising: a substrate, wherein the substrate includes a cell array region, an extension region, and a boundary region between the cell array region and the extension region; a mold structure on the substrate, wherein the mold structure includes a plurality of gate electrodes stacked alternately with a plurality of mold insulating films, and wherein the plurality of gate electrodes includes a step profile in a cross-sectional view in the extension region; a plurality of channel structures that extends in the mold structure in the cell array region, wherein each of the plurality of channel structures is in a respective channel hole that extends in the mold structure, and wherein each of the plurality of channel structures includes an information storage film on a sidewall and a bottom surface of the respective channel hole and a semiconductor pattern on the information storage film; a plurality of dummy channel structures that extends in the mold structure in the boundary region; a plurality of cell contacts electrically connected to the plurality of gate electrodes in the extension region; a plurality of word line cutting structures that separates the plurality of gate electrodes; a bit line that is electrically connected to each of the plurality of channel structures on the mold structure; a source layer between the substrate and the mold structure, wherein the source layer extends in sidewalls of the information storage film and is electrically connected to the semiconductor pattern in the cell array region; a source sacrificial layer between the substrate and the mold structure in the extension region, wherein the source sacrificial layer is spaced apart from the source layer; and a source support layer on the source layer and the source sacrificial layer, wherein the source support layer is between the source layer and the source sacrificial layer, wherein a first vertical distance from an upper surface of the source layer to an uppermost part of an upper surface of the source support layer is smaller than a second vertical distance from an upper surface of the substrate to a lowermost part of the upper surface of the source support layer, wherein a third vertical distance from an upper surface of the source sacrificial layer to the uppermost part of the upper surface of the source support layer is smaller than the second vertical distance, and wherein a first vertical level of a first bottom surface of the plurality of word line cutting structures in the cell array region is different from a second vertical level of a second bottom surface of the plurality of word line cutting structures in the extension region relative to the upper surface of the substrate.

According to some embodiments of the present disclosure, an electronic system comprising: a main board; a semiconductor memory device on the main board; and a controller electrically connected to the semiconductor memory device, on the main board, wherein the semiconductor memory device comprises: a substrate that includes a cell array region, an extension region, and a boundary region between the cell array region and the extension region; a mold structure on the substrate, wherein the mold structure includes a plurality of gate electrodes stacked alternately with a plurality of insulating films, and wherein the plurality of gate electrodes includes a step profile in a cross-sectional view in the extension region; a plurality of channel structures that extends in the mold structure in the cell array region; a plurality of dummy channel structures that extends in the mold structure in the boundary region; a plurality of cell contacts electrically connected to the plurality of gate electrodes in the extension region; a source layer between the substrate and the mold structure, wherein the source layer is electrically connected to the plurality of channel structures in the cell array region; a source sacrificial layer between the substrate and the mold structure in the extension region, wherein the source sacrificial layer is spaced apart from the source layer; and a source support layer on the source layer and the source sacrificial layer, wherein the source support layer is between the source layer and the source sacrificial layer, wherein an upper surface of the source support layer includes a first portion extending parallel to an upper surface of the substrate, a second portion extending parallel to the upper surface of the substrate, and a third portion that connects the first portion and the second portion, wherein the first portion is paced apart from the second portion, and wherein a first vertical distance from an upper surface of the source layer to the first portion is smaller than a second vertical distance from the upper surface of the substrate to the second portion.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
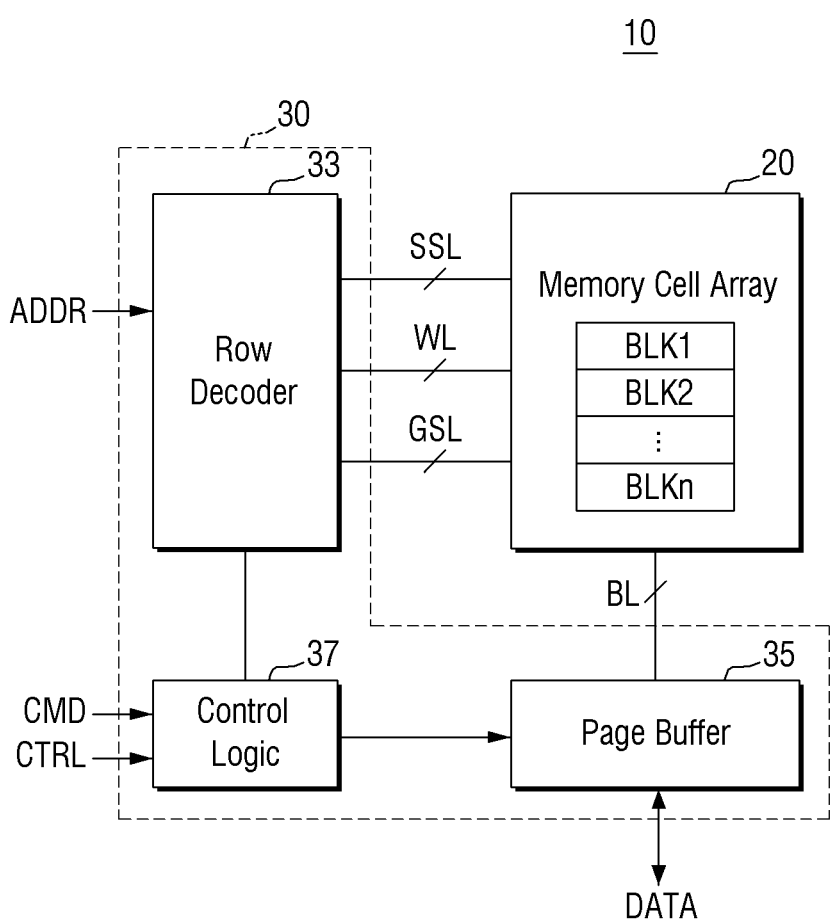
FIG. 1 is an example block diagram of a semiconductor memory device according to some embodiments.

In the present specification, although terms such as a first, a second, a top and a bottom are used to describe various elements or components, it goes without saying that these elements or components are not limited by these terms. These terms are only used to distinguish a single element or component from other elements or components. Therefore, it goes without saying that a first element or component referred to below may be a second element or component within the technical idea of the present disclosure. Further, it goes without saying that a lower element or component referred to below may be an upper element or component within the technical idea of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In contrast, when an element is referred to as being "directly coupled," "directly connected," or "directly responsive" to, or "directly on," another element, there are no intervening elements present. In addition, "electrical connection" conceptually includes a physical connection and a physical disconnection. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is disposed "directly on" or "directly on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is disposed "directly below" or "directly under" another layer, film, region, plate, or the like, the former directly contacts the latter and still another layer, film, region, plate, or the like is not disposed between the former and the latter.

Hereinafter, embodiments according to the technical concept of the present disclosure will be described with reference to the accompanying drawings. A semiconductor memory device according to some embodiments will be described with reference to FIGS. 1 to 10.

FIG. 1 is an example block diagram of a semiconductor memory device according to some embodiments.

Referring to FIG. 1, a semiconductor memory device 10 according to some embodiments may include a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be electrically connected to the peripheral circuit 30 through a bit line BL, a word line WL, at least one string selection line SSL, and at least one ground selection line GSL. Specifically, the memory cell blocks BLK1 to BLKn may be connected to a row decoder 33 through the word line WL, the string selection line SSL, and the ground selection line GSL. Further, the memory cell blocks BLK1 to BLKn may be electrically connected to a page buffer 35 through the bit line BL.

The peripheral circuit 30 may receive an address ADDR, a command CMD, and a control signal CTRL from the outside (e.g., an external device) of the semiconductor memory device 10, and may transmit and receive data DATA to and from an external device of the semiconductor memory device 10. The peripheral circuit 30 may include a control logic 37, a row decoder 33, and a page buffer 35. Although not shown, the peripheral circuit 30 may further include, for example, various sub-circuits such as an I/O circuit, a voltage generation circuit that generates various voltages necessary for the operation of the semiconductor memory device 10, and an error correction circuit for correcting error of the data DATA that is read from the memory cell array 20.

The control logic 37 may be electrically connected to the row decoder 33, the I/O circuit, and the voltage generation circuit. The control logic 37 may control the overall operations of the semiconductor memory device 10. The control logic 37 may generate various internal control signals used inside the semiconductor memory device 10 in response to the control signal CTRL. For example, the control logic 37 may adjust the voltage levels provided to the word line WL and the bit line BL when performing a memory operation such as a program operation or an erase operation.

The row decoder 33 may select at least one of the plurality of memory cell blocks BLK1 to BLKn in response to the address ADDR, and may select at least one word line WL, at least one string selection line SSL, and at least one ground selection line GSL of the selected memory cell blocks BLK1 to BLKn. Further, the row decoder 33 may transmit a voltage for performing the memory operation to the word line WL of the selected memory cell blocks BLK1 to BLKn.

The page buffer 35 may be electrically connected to the memory cell array 20 through the bit line BL. The page buffer 35 may operate as a writer driver or a sense amplifier.

Specifically, when the program operation is performed, the page buffer 35 may operate as a writer driver to apply a voltage according to the data DATA to be stored in the memory cell array 20 to the bit line BL. On the other hand, when performing the read operation, the page buffer 35 may operate as a sense amplifier to sense the data DATA stored in the memory cell array 20.

Figure 2:
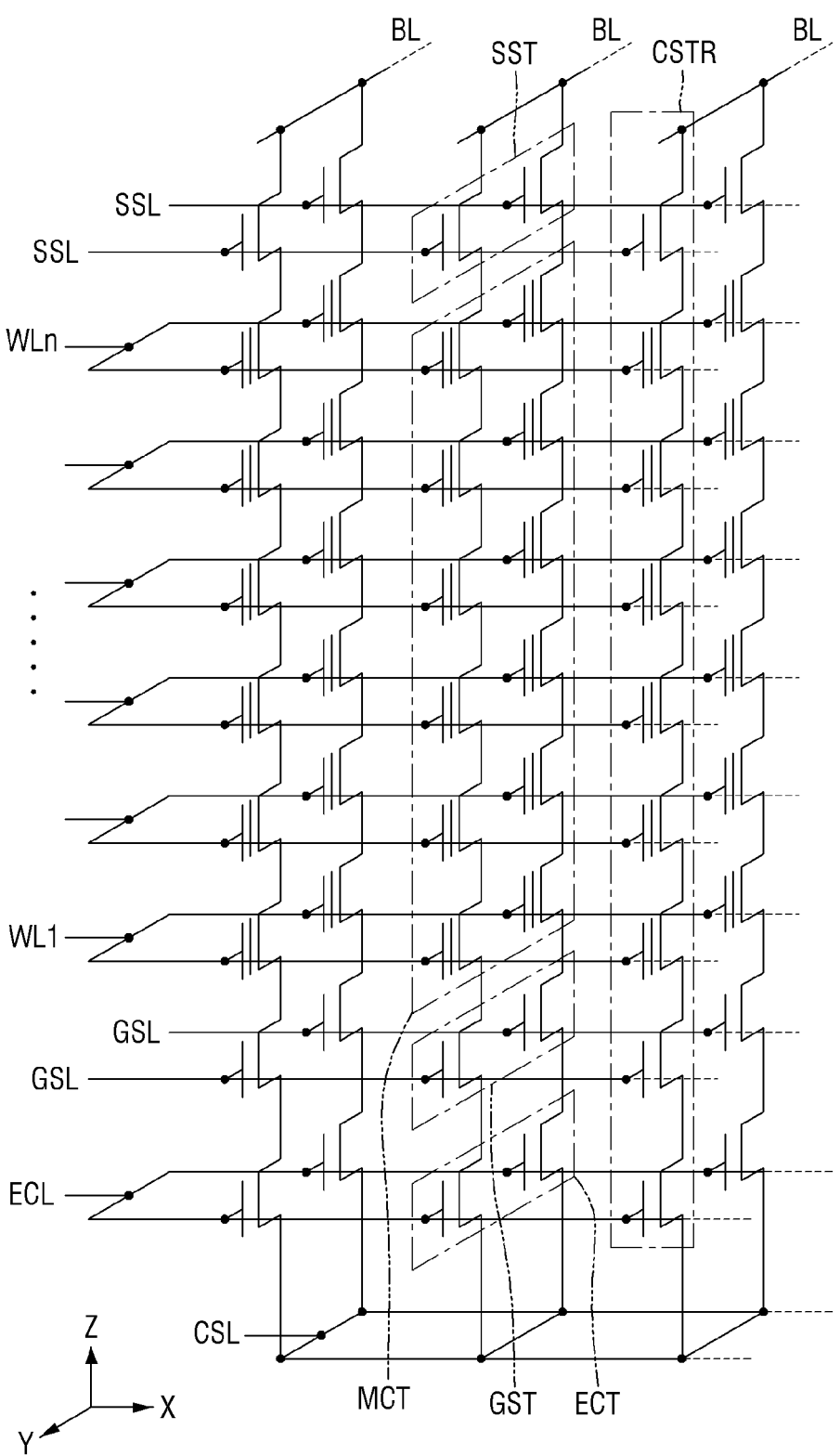
FIG. 2 is an example circuit diagram of a semiconductor memory device according to some embodiments.

FIG. 2 is an example circuit diagram of a semiconductor memory device according to some embodiments.

Referring to FIG. 2, the memory cell array (e.g., 20 of FIG. 1) of the semiconductor device according to some embodiments may include a common source line CSL, a plurality of bit lines BL, and a plurality of cell strings CSTR.

The common source line CSL may extend in a first direction X. In some embodiments, the plurality of common source lines CSL may be arranged two-dimensionally. For example, the plurality of common source lines CSL may be spaced apart from each other. Each of the plurality of common source lines CSL may extend in the first direction X. The same voltage may be electrically applied to the common source lines CSL, or different voltages may be applied to the common source lines CSL and the common source lines CSL may be controlled separately.

The plurality of bit lines BL may be arranged two-dimensionally. For example, the bit lines BL may be spaced apart from each other. Each of the plurality of bit lines BL may extend in a second direction Y that intersects the first direction X. A plurality of cell strings CSTR may be connected in parallel to each bit line BL. The cell strings CSTR may be commonly connected to the common source line CSL. That is, the plurality of cell strings CSTR may be disposed between the bit lines BL and the common source line CSL.

Each cell string CSTR may include a ground selection transistor GST connected to the common source line CSL, a string selection transistor SST connected to the bit line BL, and a plurality of memory cell transistors MCT disposed between the ground selection transistor GST and the string selection transistor SST. Each memory cell transistor MCT may include a data storage element. The ground selection transistor GST, the string selection transistor SST and the memory cell transistors MCT may be connected in series in a third direction Z. In the present description, the first direction X, the second direction Y, and the third direction Z may be perpendicular to each other. For example, the third direction Z may be perpendicular to a plane extending in the first direction X and the second direction Y.

The common source line CSL may be commonly connected to sources of the ground selection transistors GST. Also, the ground selection line GSL, a plurality of word lines WL1 to WLn, and the string selection line SSL may be disposed between the common source line CSL and the bit line BL. The ground selection line GSL may be used as a gate electrode of the ground selection transistor GST, the word lines WL1 to WLn may be used as gate electrodes of the memory cell transistors MCT, and the string selection line SSL may be used as a gate electrode of the string selection transistor SST.

In some embodiments, an erasure control transistor ECT may be disposed between the common source line CSL and the ground selection transistor GST. The common source line CSL may be commonly connected to the sources of the erasure control transistors ECT.

Further, an erasure control line ECL may be disposed between the common source line CSL and the ground selection line GSL. The erasure control line ECL may be used as a gate electrode of the erasure control transistor ECT.

The erasure control transistors ECT may generate a gate induced drain leakage (GIDL) to perform the erasure operation of the memory cell array.

Figure 3:
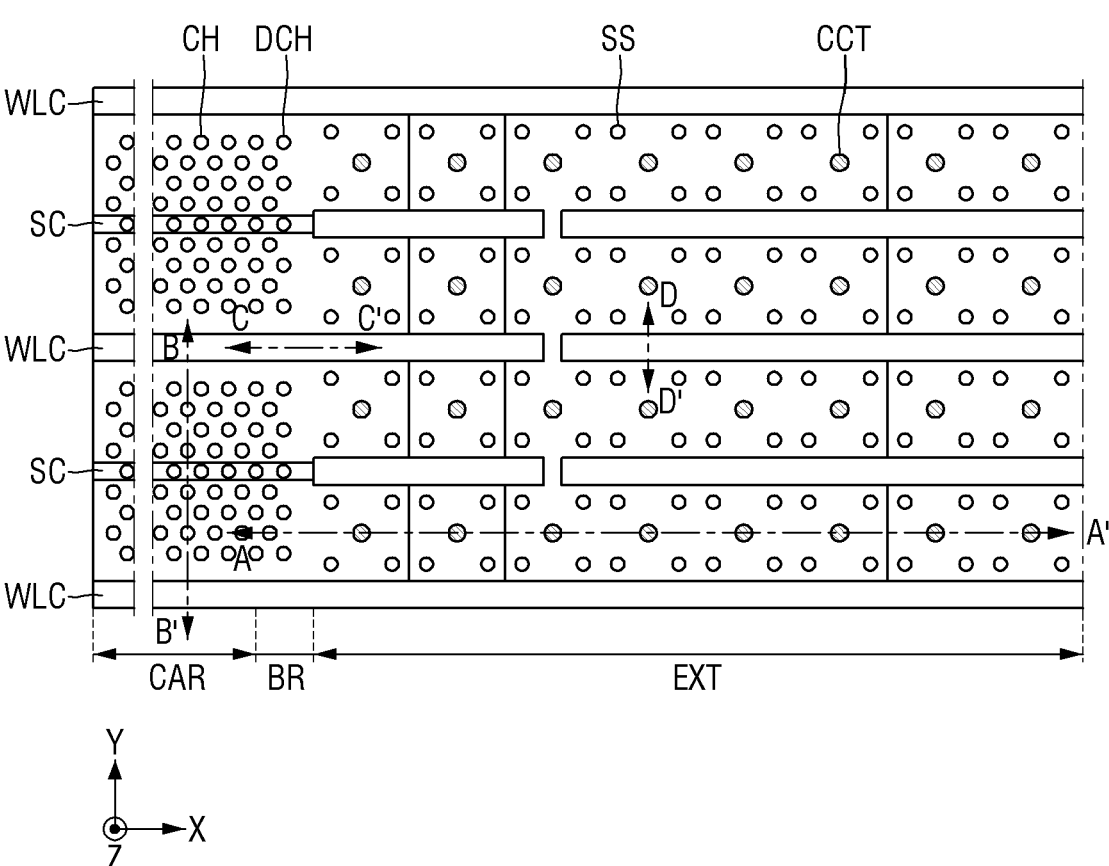
FIG. 3 is an example plan view of a semiconductor memory device according to some embodiments.
Figure 4:
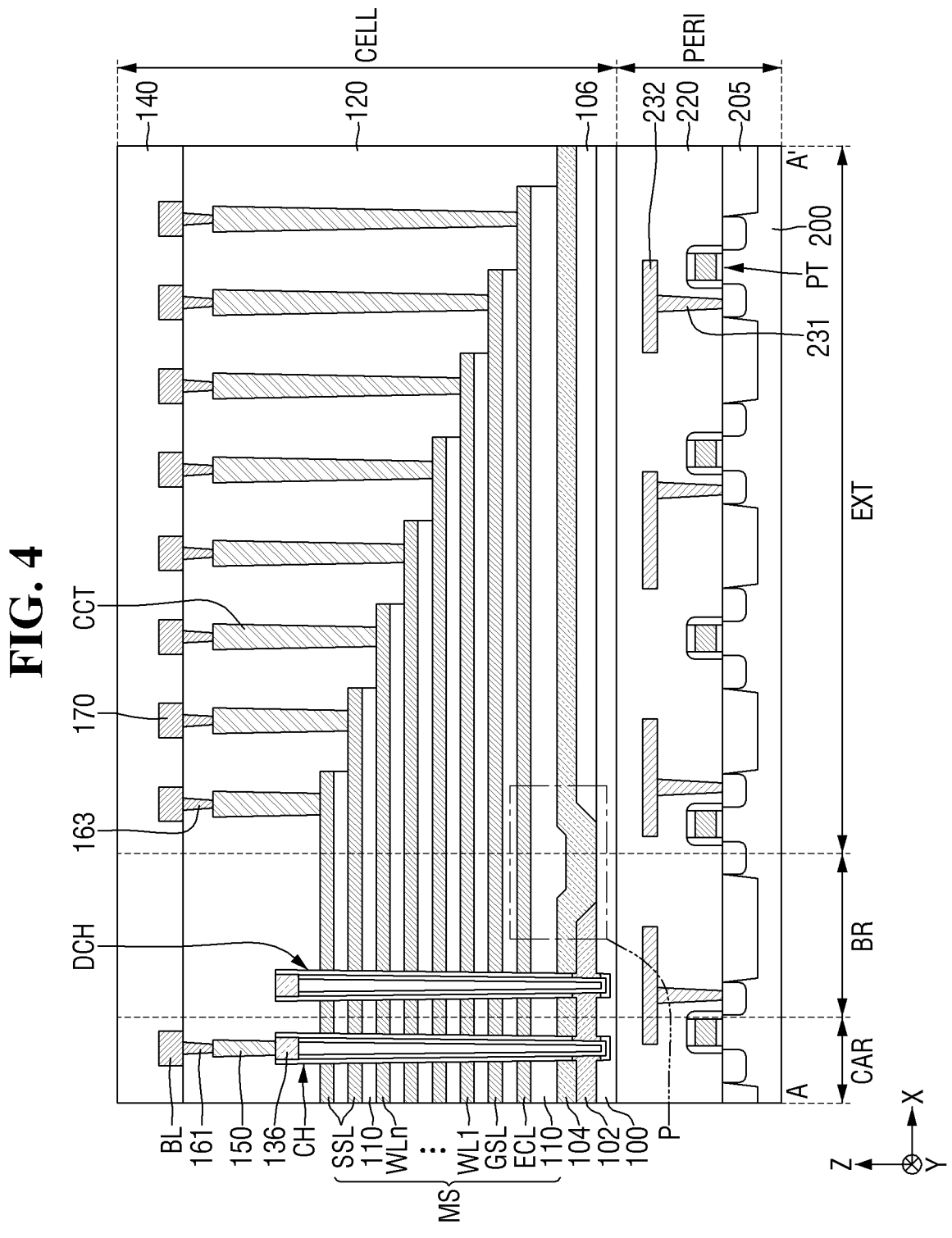
FIG. 4 is an example cross-sectional view taken along line A-A' of FIG. 3 according to some embodiments.
Figure 5:
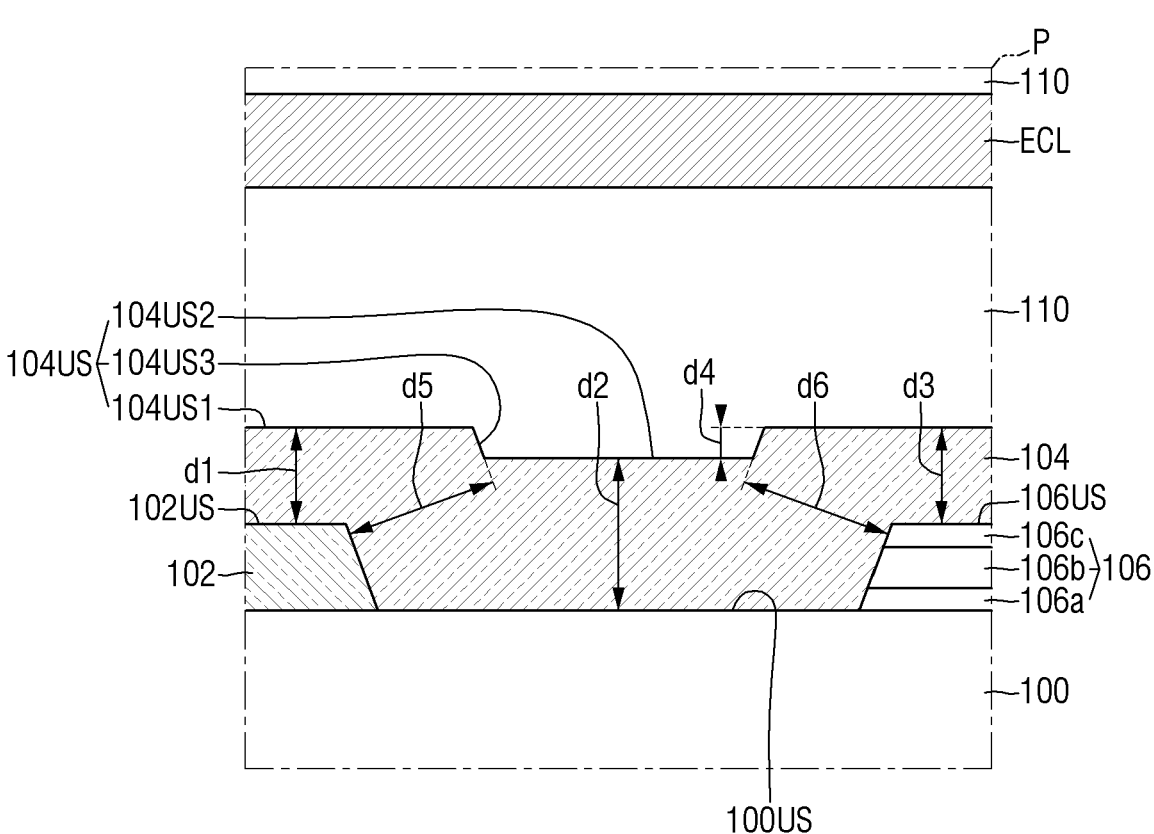
FIG. 5 is an enlarged view of a region P of FIG. 4 according to some embodiments.
Figure 6:
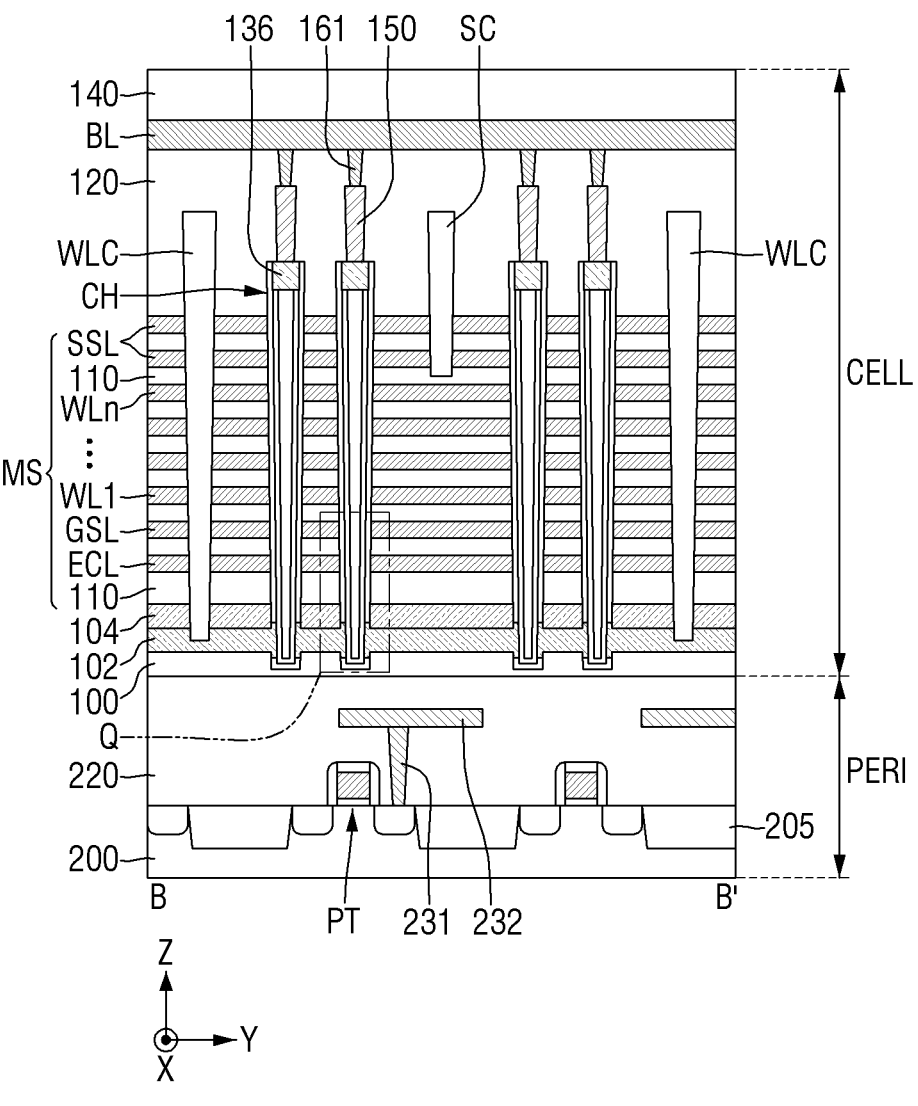
FIG. 6 is an example cross-sectional view taken along line B-B' of FIG. 3 according to some embodiments.
Figure 7:
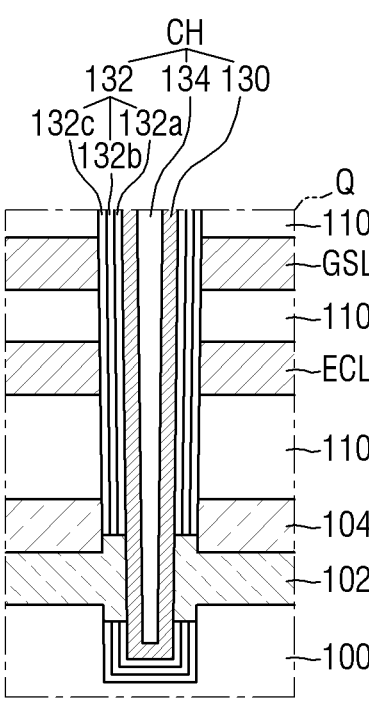
FIG. 7 is an enlarged view of a region Q of FIG. 6 according to some embodiments.
Figure 8:
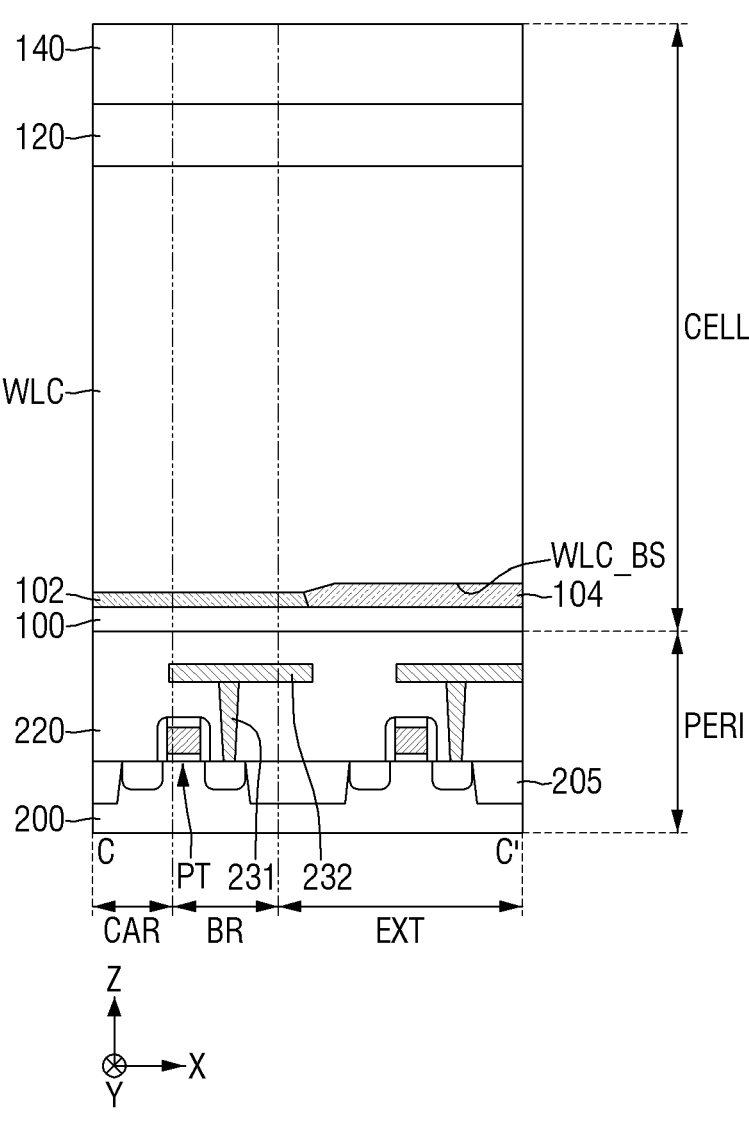
FIG. 8 is an example cross-sectional view taken along line C-C' of FIG. 3 according to some embodiments.
Figure 9:
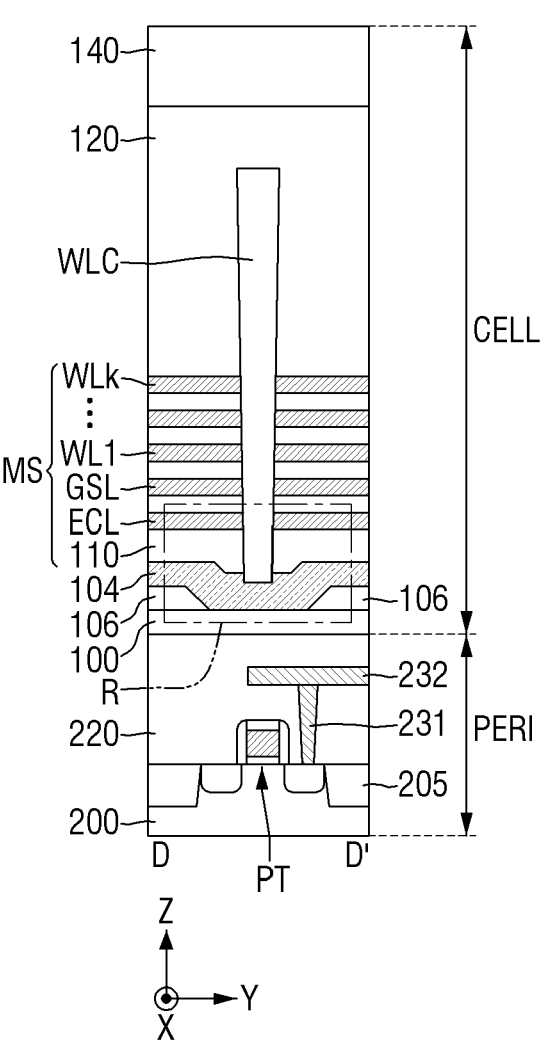
FIG. 9 is an example cross-sectional view taken along line D-D' of FIG. 3 according to some embodiments.
Figure 10:
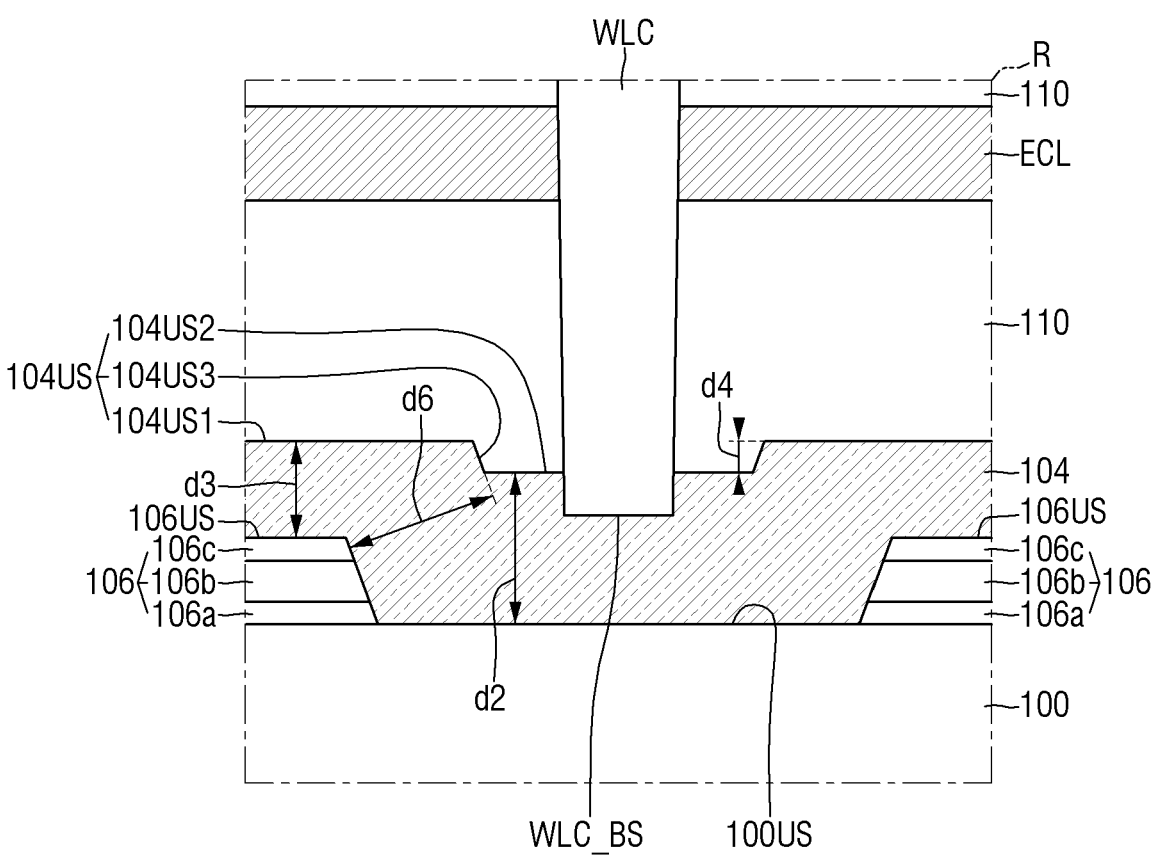
FIG. 10 is an enlarged view of a region R of FIG. 9 according to some embodiments.

FIG. 3 is an example plan view of a semiconductor memory device according to some embodiments. FIG. 4 is an example cross-sectional view taken along line A-A' of FIG. 3 according to some embodiments. FIG. 5 is an enlarged view of a region P of FIG. 4 according to some embodiments. FIG. 6 is an example cross-sectional view taken along line B-B' of FIG. 3 according to some embodiments. FIG. 7 is an enlarged view of a region Q of FIG. 6 according to some embodiments. FIG. 8 is an example cross-sectional view taken along line C-C' of FIG. 3 according to some embodiments. FIG. 9 is an example cross-sectional view taken along line D-D' of FIG. 3 according to some embodiments. FIG. 10 is an enlarged view of a region R of FIG. 9 according to some embodiments.

Referring to FIGS. 3 to 10, a semiconductor memory device according to some embodiments may include a cell structure CELL and a peripheral circuit structure PERI.

In some embodiments, the cell structure CELL may include a substrate 100, a mold structure MS, a first interlayer insulating film 120, a second interlayer insulating film 140, a channel structure CH, a dummy channel structure DCH, a word line cutting structure WLC, a source layer 102, a source support layer 104, a source sacrificial layer 106, a bit line BL, and a plurality of cell contacts CCT.

The semiconductor memory device according to some embodiments may include a cell array region CAR, a boundary region BR, and an extension region EXT. The boundary region BR may be provided between the cell array region CAR and the extension region EXT. The cell array region CAR, the boundary region BR and the extension region EXT may be connected to each other.

A memory cell array (e.g., 20 of FIG. 1) including a plurality of memory cells may be formed in the cell array region CAR. For example, a channel structure CH, a bit line BL, gate electrodes ECL, GSL, WL1 to WLn, and SSL and the like, which will be described below, may be disposed in the cell array region CAR.

A plurality of dummy channel structures DCH may be disposed in the boundary region BR. The plurality of dummy channel structures DCH may be channel structures that do not operate. For example, the plurality of dummy channel structures DCH may not be electrically connected to (e.g., may be electrically insulated from) the bit line BL.

The extension region EXT may be disposed around the cell array region CAR. The extension region EXT may be disposed around the boundary region BR. The gate electrodes ECL, GSL, WL1 to WLn, and SSL, which will be described below, may be stacked in a stepwise (stair shape) form in the extension region EXT. For example, the gate electrodes ECL, GSL, WL1 to WLn, and SSL may extend in different lengths in the first direction X and have step profiles in a cross-sectional view. In some embodiments, the gate electrodes ECL, GSL, W11 to WLn, and SSL may extend in different lengths in the second direction Y and have step profiles in a cross-sectional view. The step profile may mean that the gate electrodes ECL, GSL, WL1 to WLn, and SSL may have a smaller size as a distance in the third direction Z from the upper surface 100US of the substrate 100 increases. For example, in a plan view, the gate electrodes ECL, GSL, WL1 to WLn, and SSL may have a smaller length in the first direction X and/or in the second direction Y as the distance in the third direction Z from the upper surface 100US of the substrate 100 increases. Also, a plurality of cell contacts CCT and the like, which will be described below, may be disposed in the extension region EXT.

The substrate 100 may include the cell array region CAR, the boundary region BR, and the extension region EXT. The substrate 100 may include, for example, a semiconductor substrate such as a silicon substrate, a germanium substrate or a silicon-germanium substrate. In some embodiments, the substrate 100 may include, for example, a silicon-on-insulator (SOI) substrate, a germanium-on-insulator (GOI) substrate, and the like. In some embodiments, the substrate 100 may include impurities. For example, the substrate 100 may include n-type impurities (e.g., phosphorus (P), arsenic (As), etc.), but is not limited thereto.

The mold structure MS may be provided on a front side (e.g., an upper surface 100US) of the substrate 100. The mold structure MS may include the gate electrodes ECL, GSL, WL1 to WLn, and SSL and a plurality of mold insulating films 110 which are alternately stacked on the substrate 100. Each of the gate electrodes ECL, GSL, WL1 to WLn, and SSL and each of the mold insulating films 110 may have a layered structure extending parallel to the upper surface 100US of the substrate 100. The gate electrodes ECL, GSL, WL1 to WLn, and SSL may be spaced apart from each other in the third direction Z by the mold insulating film 110 and sequentially stacked on the substrate 100.

The gate electrodes ECL, GSL, WL1 to WLn, and SSL may be stacked in a stepwise (stair shape) form in the extension region EXT. For example, the gate electrodes ECL, GSL, WL1 to WLn, and SSL may extend in different lengths in the first direction X and have step profiles in a cross-sectional view. In some embodiments, the gate electrodes ECL, GSL, WL1 to WLn, and SSL may extend in different lengths in the second direction Y and have step profiles in a cross-sectional view. The step profile may mean that the gate electrodes ECL, GSL, WL1 to WLn, and SSL may have a smaller size as a distance in the third direction Z from the upper surface 100US of the substrate 100 increases. For example, in a plan view, the gate electrodes ECL, GSL, WL1 to WLn, and SSL may have a smaller length in the first direction X and/or in the second direction Y as the distance in the third direction Z from the upper surface 100US of the substrate 100 increases. Therefore, each of the gate electrodes ECL, GSL, WL1 to WLn, and SSL may be exposed from other gate electrodes. The exposed region may mean a region in which each of the plurality of cell contacts CCT and the gate electrodes ECL, GSL, WL1 to WLn, and SSL are electrically connected (e.g., in contact) with each other.

In some other embodiments, the erasure control line ECL may be omitted.

The mold insulating film 110 may be stacked in a stepwise (stair shape) form in the extension region EXT. For example, the mold insulating films 110 may extend in different lengths in the first direction X and have step profiles in a cross-sectional view. In some embodiments, the mold insulating film 110 may extend in different lengths in the second direction Y and have step profiles in a cross-sectional view. For example, the farther the mold insulating film 110 from the substrate 100, the smaller lengths the mold insulating film 110 may have in the first direction X and/or the second direction Y. In a plan view, the mold insulating film 110 may have a smaller length in the first direction X and/or in the second direction Y as the distance in the third direction Z from the upper surface 100US of the substrate increases.

The gate electrodes ECL, GSL, WL1 to WLn, and SSL may each include, but are not limited to, a conductive material, for example, a metal such as tungsten (W), cobalt (Co) and nickel (Ni) or a semiconductor material such as silicon. As an example, the gate electrodes ECL, GSL, WL1 to WLn, and SSL may each include tungsten (W). The gate electrodes ECL, GSL, WL1 to WLn, and SSL may be multi-films, unlike the shown example. For example, when the gate electrodes ECL, GSL, WL1 to WLn, and SSL are multi-films, the gate electrodes ECL, GSL, WL1 to WLn, and SSL may include a gate electrode barrier film and a gate electrode filling film. The gate electrode barrier film may include, for example, but is not limited to, titanium nitride (TiN), and the gate electrode filling film may include tungsten (W) but is not limited thereto.

The mold insulating film 110 may include an insulating material, for example, but is not limited to, silicon oxide, silicon nitride, and silicon oxynitride.

The channel structure CH may be provided in the mold structure MS of the cell array region CAR. The channel structure CH may extend in a vertical direction (hereinafter referred to as the third direction Z) perpendicular to the upper surface 100US of the substrate 100 to penetrate the mold structure MS. The channel structure CH may extend in the mold structure MS. For example, the channel structure CH may have a pillar shape (for example, a cylindrical shape) extending in the third direction Z. Therefore, the channel structure CH may intersect each of the gate electrodes ECL, GSL, WL1 to WLn, and SSL. The channel structure CH may be disposed in a channel hole penetrating the mold structure MS in the third direction Z. In some embodiments each of a plurality of channel structures CH may be disposed in the respective channel hole.

The channel structure CH may include a semiconductor pattern 130 and an information storage film 132.

The semiconductor pattern 130 may extend in the third direction Z and penetrate the mold structure MS. Although the semiconductor pattern 130 is only shown to have a cup shape, this is only an example. For example, the semiconductor pattern 130 may have various shapes such as a cylindrical shape, a rectangular barrel shape, and a solid filler shape, but is not limited thereto. The semiconductor pattern 130 may include, for example, but is not limited to, a semiconductor material such as single crystal silicon, polycrystalline silicon, organic semiconductor substance and carbon nanostructure.

The information storage film 132 may be interposed between the semiconductor pattern 130 and each of the gate electrodes ECL, GSL, WL1 to WLn, and SSL. For example, the information storage film 132 may extend along at least a part of the outer side face of the semiconductor pattern 130. The information storage film 132 may extend along at least a part of the sidewall and the bottom face of the semiconductor pattern 130. The information storage film 132 may include, for example, silicon oxide, silicon nitride, silicon oxynitride, and/or high dielectric constant materials having a higher dielectric constant than silicon oxide. The high dielectric constant material may include, for example, aluminum oxide, hafnium oxide, lanthanum oxide, tantalum oxide, titanium oxide, lanthanum hafnium oxide, lanthanum aluminum oxide, dysprosium scandium oxide, and/or combinations thereof.

In some embodiments, the plurality of channel structures CH may be arranged in the form of a zigzag in a plan view. For example, as shown in FIG. 3, a plurality of channel structures CH may be arranged alternately in the first direction X and the second direction Y. The plurality of channel structures CH arranged in the form of a zigzag may further improve the degree of integration of the semiconductor memory device. In some embodiments, the plurality of channel structures CH may be arranged in the form of a honeycomb in a plan view.

In some embodiments, a dummy channel structure DCH may be formed inside the mold structure MS in the boundary region BR. The dummy channel structure DCH may extend in the third direction Z in the mold structure MS. The dummy channel structure DCH may be formed in a shape similar to the channel structure CH to reduce the stress which is applied to the mold structure MS in the boundary region BR.

In some embodiments, a supporter structure SS may be formed inside the mold structure MS in the extension region EXT. The support structure SS may be disposed around the cell contact CCT from a viewpoint of a plan view. The support structure SS may be formed in the shape similar to the channel structure CH to reduce the stress which is applied to the mold structure MS in the extension region EXT.

In some embodiments, the information storage film 132 may be formed of multi-films. For example, as shown in FIG. 7, the information storage film 132 may include a tunnel insulating film 132a, a charge storage film 132b and a blocking insulating film 132c which are sequentially stacked on the outer side surface of the semiconductor pattern 130. The composition of the information storage film 132 is not limited thereto.

The tunnel insulating film 132a may include, for example, silicon oxide and/or a high dielectric constant material having a higher dielectric constant than silicon oxide (e.g., aluminum oxide ($Al_2O_3$) and hafnium oxide ($HfO_2$)). The charge storage film 132b may include, for example, silicon nitride. The blocking insulating film 132c may include, for example, silicon oxide and/or a high dielectric constant material having a higher dielectric constant than silicon oxide (e.g., aluminum oxide ($Al_2O_3$), and hafnium oxide ($HfO_2$)).

In some embodiments, the channel structure CH may further include a filling pattern 134. The filling pattern 134 may be formed to fill the inside of the (e.g., cup-shaped) semiconductor pattern 130. The filling pattern 134 may include, but is not limited to, an insulating material, for example, silicon oxide.

In some embodiments, the channel structure CH may further include a channel pad 136. The channel pad 136 may be formed to be connected to the semiconductor pattern 130. For example, the channel pad 136 may be formed in the first interlayer insulating film 120 to be described below and connected to the upper part of the semiconductor pattern 130. The channel pad 136 may include, for example, but is not limited to, impurity-doped polysilicon.

In some embodiments, a source layer 102, a source support layer 104 and a source sacrificial layer 106 may be disposed on the substrate 100. The source layer 102 and the source sacrificial layer 106 may be interposed between the substrate 100 and the mold structure MS. For example, the source layer 102 and the source sacrificial layer 106 may extend along the upper surface 100 US of the substrate 100.

Specifically, the source layer 102 may be disposed on the substrate 100 of the cell array region CAR. A part of the source layer 102 may be disposed on the substrate 100 of the boundary region BR, but is not limited thereto. In some embodiments, the source layer 102 may be formed to be (e.g., electrically) connected to the semiconductor pattern 130 of the channel structure CH. For example, as shown in FIG. 7, the source layer 102 may penetrate the information storage film 132 and be in contact with the semiconductor pattern 130. For example, the source layer 102 may penetrate sidewalls of the information storage film 132 and be (e.g., electrically) connected to the semiconductor pattern 130.

The source layer 102 may be provided as a common source line (e.g., CSL of FIG. 2) of a semiconductor memory device. The source layer 102 may be formed of, for example, but is not limited to, an impurity-doped polysilicon film or a conductive film.

In some embodiments, the channel structure CH and the dummy channel structure DCH may each extend in (e.g., penetrate the) source layer 102 and the source support layer 104. For example, a lower part of the channel structure CH and a lower part of the dummy channel structure DCH may penetrate the source layer 102 and the source support layer 104, and be disposed in the substrate 100.

A source sacrificial layer 106 may be disposed on the substrate 100 in the extension region EXT. Although the source sacrificial layer 106 is shown as not being disposed on the substrate 100 in the boundary region BR, this is only for convenience of explanation, and the embodiment is not limited thereto. It goes without saying that the source sacrificial layer 106 may be disposed in the boundary region BR unlike the shown example.

In FIGS. 5 and 10, the source sacrificial layer 106 may include a first layer 106a, a second layer 106b, and a third layer 106c that are sequentially stacked on the substrate 100. The first layer 106a may be in contact with the upper surface 100 US of the substrate 100. The third layer 106c may be in contact with the source support layer 104. The second layer 106b may be disposed between the first layer 106a and the third layer 106c.

In some embodiments, the source layer 102 may be formed in a place from which the source sacrificial layer 106 disposed on the substrate 100 in the cell array region CAR is removed. That is, when the source layer 102 is formed, the source sacrificial layer 106 on the substrate 100 in the cell array region CAR may be removed, and the source sacrificial layer 106 on the substrate 100 in the extension region EXT may not be removed.

The source sacrificial layer 106 may include, for example, silicon oxide, silicon nitride, and/or silicon oxynitride. For example, the first layer 106a and the third layer 106c may each be formed of a silicon oxide film, and the second layer 106b may be formed of a silicon nitride film, but the embodiment is not limited thereto.

In some embodiments, the source layer 102 may be spaced apart from the source sacrificial layer 106. The source support layer 104 may be filled between the source layer 102 and the source sacrificial layer 106. The source support layer 104 may be on the source layer 102 and the source sacrificial layer 106. The source support layer 104 may, at least partially, cover the source layer 102 and the source sacrificial layer 106. In some embodiments, the source support layer 104 may be used as a support layer for preventing the mold structure MS from collapsing or falling in a process for forming the source layer 102.

In FIGS. 5 and 10, an upper surface 104US of the source support layer 104 may include a first portion 104US1, a second portion 104US2, and a third portion 104US3.

The first portion 104US1 may extend in the first direction X and/or the second direction Y. The first portion 104US1 may be parallel to the upper surface 100US of the substrate 100. The first portion 104US1 may extend alongside the upper surface 100US of the substrate 100.

The second portion 104US2 may be spaced apart from the first portion 104US1. The second portion 104US2 may be spaced apart from the first portion 104US1 in the first direction X and/or the second direction Y. The second portion 104US2 may extend in the first direction X and/or the second direction Y. The second portion 104US2 may be parallel to the upper surface 100US of the substrate 100 and the first portion 104US1. The second portion 104US2 may extend alongside the upper surface 100US of the substrate 100 and the first portion 104US1.

The third portion 104US3 may connect the first portion 104US1 and the second portion 104US2. The third portion 104US3 may extend in a direction different from the first direction X, the second direction Y, and the third direction Z. That is, the third portion 104US3 may not be parallel to the upper surface 100US of the substrate 100.

In some embodiments, the first portion 104US1 may be an uppermost part of the upper surface 104US of the source support layer 104. The second portion 104US2 may be a lowermost part of the upper surface 104US of the source support layer 104. As used herein, the term "uppermost part" may mean a portion disposed at the farthest distance (e.g., highest vertical level) from the upper surface 100US of the substrate 100 in a vertical direction (e.g., third direction Z). In this specification, the term "lowermost part" may refer to a portion disposed at the closest distance (e.g., lowest vertical level) from the upper surface 100US of the substrate 100 in the vertical direction (e.g., third direction Z). A vertical level may mean a distance from the upper surface 100US of the substrate 100 in a direction perpendicular to the upper surface 100US of the substrate 100 (e.g., the third direction Z). For example, the highest vertical level may mean the farthest distance from the upper surface 100US of the substrate 100 in the third direction Z. The lowest vertical level may mean the closest distance from the upper surface 100US of the substrate 100 in the third direction Z.

In some embodiments, the upper surface 104US of the source support layer 104 may be disposed at various distances in the third direction Z from the upper surface 100US of the substrate 100. For example, the vertical level of the first portion 104US1 of the upper surface 104US of the source support layer 104 may be different from the vertical level of the second portion 104US2 of the upper surface 104US of the source support layer 104. For example, the vertical level of the first portion 104US1 may be higher than the vertical level of the second portion 104US2. The first portion 104US1 may be farther in the third direction Z from the upper surface 100US of the substrate 100 than the second portion 104US2.

In some embodiments, a vertical distance from the upper surface 100US of the substrate 100 to the first portion 104US1 may be greater than a second vertical distance d2 from the upper surface 100US of the substrate 100 to the second portion 104US2. A vertical distance from A to B may mean, for example, a distance between a plane including A, which is parallel to the upper surface 100US of the substrate 100, and a plane including B, which is parallel to the upper surface 100US of the substrate 100, in a direction perpendicular to the upper surface 100US of the substrate 100 (e.g., the third direction Z). Also, a fourth vertical distance d4 from the vertical level (e.g., third direction Z) of the first portion 104US1 to the vertical level of the second portion 104US2 may be greater than 0. For example, the fourth vertical distance d4 from the vertical level of the first portion 104US1 to the vertical level of the second portion 104US2 may be greater than 0 angstrom (A) and equal to or less than 50 Å. However, the present disclosure is not limited thereto.

In the semiconductor memory device according to some embodiments, since the fourth vertical distance d4 may be equal to or less than 50 Å, the process margin can be improved in the process of forming the word line cutting structure WLC, which will be described below.

In some embodiments, a first vertical distance d1 from an upper surface 102US of the source layer 102 to the first portion 104US1 may be smaller than the second vertical distance d2 from the upper surface 100US of the substrate 100 to the second portion 104US2. That is, a thickness of the source layer 102 in the third direction Z may be greater than the fourth vertical distance d4. Also, a third vertical distance d3 from an upper surface 106US of the source sacrificial layer 106 to the first portion 104US1 may be smaller than the second vertical distance d2 from the upper surface 100US of the substrate 100 to the second portion 104US2. That is, the thickness of the source sacrificial layer 106 in the third direction Z may be greater than the fourth vertical distance d4.

In some embodiments, a minimum distance d5 from the source layer 102 to the third portion 104US3 may be equal to the second vertical distance d2. As used herein, the expression "minimum distance from A to B" may mean the shortest distance among distances from a plane including A to a plane including B. The plane including A and the plane including B may be parallel to each other. For example, the minimum distance d5 may be the shortest distance from the source layer 102 to an imaginary plane extended along and from the third portion 104US3 in a cross-sectional view.

Similarly, a minimum distance d6 from the source sacrificial layer 106 to the third portion 104US3 may be equal to the second vertical distance d2. For example, the minimum distance d6 may be the shortest distance from the source sacrificial layer 106 to an imaginary line extended along and from the third portion 104US3 in a cross-sectional view. That is, the minimum distance d5 from the source layer 102 to the third portion 104US3 may be equal to the minimum distance d6 from the source sacrificial layer 106 to the third portion 104US3. However, the technical idea of the present disclosure is not limited thereto.

As the semiconductor memory device according to some embodiments has the structure described above, the process margin can be improved in the process of forming the word line cutting structure WLC, which will be described below. Therefore, a semiconductor memory device having improved reliability may be fabricated.

The source support layer 104 may be formed of, but is not limited to, a polysilicon film which is not doped with impurity. Although not shown, a base insulating film may be interposed between the substrate 100 and the source layer 102. The base insulating film may include, for example, but is not limited to, silicon oxide, silicon nitride, and/or silicon oxynitride.

The word line cutting structure WLC may extend through (e.g., cut) the mold structure MS in a cross-sectional view. The word line cutting structure WLC may extend through (e.g., cut) the gate electrodes ECL, GSL, WL1 to WLn, and SSL. For example, the word line cutting structure WLC may separate the gate electrodes ECL, GSL, WL1 to WLn, and SSL. The mold structure MS may be cut by the word line cutting structure WLC to form a plurality of memory cell blocks (e.g., BLK1 to BLKn of FIG. 1). For example, although not shown, two adjacent word line cutting structures WLC may define one memory cell block between them. A plurality of channel structures CH may be disposed inside each memory cell block defined by the two adjacent word line cutting structures WLC.

In some embodiments, the word line cutting structure WLC may cut (e.g., extend in) at least portions of the source layer 102 and the source support layer 104. In the cell array region CAR, although a bottom surface WLC_BS of the word line cutting structure WLC is only shown as being disposed between the lower surface of the source layer 102 and the upper surface 102US of the source layer 102, this is only an example. In some embodiments, the bottom surface WLC_BS of the word line cutting structure WLC may be disposed at a vertical level lower (e.g., closer to the upper surface 100US or the substrate 100) than the lower surface of the source layer 102.

In FIG. 8, the vertical level of the bottom surface WLC_BS of the word line cutting structure WLC on the substrate 100 in the cell array region CAR may be different from the vertical level of the bottom surface WLC_BS of the word line cutting structure WLC on the substrate 100 in the extension region EXT, on the basis of the upper surface 100US of the substrate 100.

In some embodiments, the vertical level of the bottom surface WLC_BS of the word line cutting structure WLC on the substrate 100 in the cell array region CAR may be lower than the vertical level of the bottom surface WLC_BS of the word line cutting structure WLC on the substrate 100 in the extension region EXT. For example, the bottom surface WLC_BS of the word line cutting structure WLC on the substrate 100 in the cell array region may be closer to the upper surface 100US of the substrate 100 than the bottom surface WLC BS of the word line cutting structure WLC on the substrate 100 in the extension region EXT in the third direction Z. This may be due to the fact that an etching process is additionally performed when forming the word line cutting structure WLC on the substrate 100 in the cell array region CAR. Therefore, at least a part of the word line cutting structure WLC on the substrate 100 in the cell array region CAR may be disposed inside the source layer 102.

In addition, the bottom surface WLC_BS of the word line cutting structure WLC on the substrate 100 in the cell array region CAR may be in contact with the source layer 102, and the bottom surface WLC_BS of the word line cutting structure WLC on the substrate 100 of the extension region EXT may be in contact with the source support layer 104, but the embodiment is not limited thereto.

In FIGS. 9 and 10, the word line cutting structure WLC on the substrate 100 in the extension region EXT may not be in contact with (e.g., may be spaced apart from) the source sacrificial layer 106. The word line cutting structure WLC on the substrate 100 in the extension region EXT does not overlap the source sacrificial layer 106 in the third direction Z. Also, although the word line cutting structure WLC on the substrate 100 in the extension region EXT is shown as not overlapping the source sacrificial layer 106 in the second direction Y, the technical idea of the present disclosure is not limited thereto.

At this time, the vertical level of the bottom surface WLC_BS of the word line cutting structure WLC on the substrate 100 in the extension region EXT may be higher than the vertical level of the upper surface 106US of the source sacrificial layer 106. That is, the vertical distance in the third direction Z from the upper surface 100US of the substrate 100 to the bottom surface WLC_BS of the word line cutting structure WLC on the substrate 100 in the extension region EXT may be greater than the vertical distance in the third direction Z from the upper surface 100US of the substrate 100 to the upper surface 106US of the source sacrificial layer 106. However, the technical idea of the present disclosure is not limited thereto.

In some embodiments, the word line cutting structure WLC may include an insulating material. For example, the insulating material may fill the word line cutting structure WLC. The insulating material may include, for example, but is not limited to, silicon oxide, silicon nitride, and/or silicon oxynitride.

In some embodiments, in the cross-section of FIG. 9, a word line WLk disposed at the highest level may be a k-th word line. The word line WLk may be the highest vertical level word line in the third direction Z in a portion of the extension region EXT. The word line WLk may be lower than the highest word line in the cell array region CAR (e.g., WLn) in the third direction Z. However, the technical idea of the present disclosure is not limited thereto.

In FIGS. 3 and 6, a string isolation structure SC may be provided inside the mold structure MS. The string isolation structure SC may cut (e.g., extend through) the string selection line SSL. Each memory cell block (e.g., BLK1 to BLKn of FIG. 1) defined by the word line cutting structures WLC may be divided by the string isolation structures SC to form a plurality of string regions. For example, the string isolation structure SC may define two string regions inside one memory cell block. The string isolation structures SC may include an insulating material. For example, the string isolation structure SC may include, but is not limited to, silicon oxide, silicon nitride, and/or silicon oxynitride.

The first interlayer insulating film 120 may be disposed on the mold structure MS. The first interlayer insulating film 120 may be disposed on (e.g., cover) the plurality of channel structures CH, the plurality of dummy channel structures DCH, and the plurality of cell contacts CCT. The first interlayer insulating film 120 may include, for example, an oxide-based insulating material. The first interlayer insulating film 120 may include, for example, but is not limited to, silicon oxide, silicon oxynitride, and/or a low dielectric constant (low-k) material having a lower dielectric constant than silicon oxide.

A second interlayer insulating film 140 may be disposed on the first interlayer insulating film 120. The second interlayer insulating film 140 may be disposed on (e.g., cover) the bit lines BL and the plurality of metal patterns 170. The second interlayer insulating film 140 may include, for example, an oxide-based insulating material. The second interlayer insulating film 140 may include, for example, but is not limited to, silicon oxide, silicon oxynitride, and/or a low-k material having a lower dielectric constant than silicon oxide.

The bit line BL may be disposed on the substrate 100 in the cell array region CAR. The bit line BL may be formed on the mold structure MS. The bit line BL may be a bit line (BL of FIG. 2) of the semiconductor memory device. The bit line BL may be disposed in the second interlayer insulating film 140. The bit line BL may extend in the second direction Y.

Also, the bit line BL may be electrically connected to the plurality of channel structures CH. For example, first and second bit line contacts 150 and 161 connected to upper parts of each channel structure CH may be formed inside the first interlayer insulating film 120. The first bit line contact 150 may be disposed on the channel structure CH. The first bit line contact 150 may be connected to the channel pad 136. The second bit line contact 161 may be disposed on the first bit line contact 150. The second bit line contact 161 may be connected to the bit line BL. The second bit line contact 161 may be provided between the bit line BL and the first bit line contact 150. The bit line BL may be electrically connected to the channel structure CH through the first and second bit line contacts 150 and 161.

The bit line BL may not be disposed on the mold structure MS in the boundary region BR. The bit line BL may not be electrically connected to the dummy channel structure DCH.

The bit line BL may include a conductive material. For example, the bit line BL may include, but is not limited to, tungsten (W) or copper (Cu).

A plurality of cell contacts CCT may be provided on the substrate in the extension region EXT. The plurality of cell contacts CCT may extend in the third direction Z and penetrate the first interlayer insulating film 120 in the extension region EXT. Each of the plurality of cell contacts CCT may be electrically connected to one of the plurality of gate electrodes ECL, GSL, WL1 to WLn, and SSL. For example, the plurality of cell contacts CCT may each land on the gate electrode disposed at the highest level among the plurality of gate electrodes ECL, GSL, WL1 to WLn, and SSL. That is, each of the plurality of cell contacts CCT may be electrically connected to the gate electrode disposed at the highest level among the plurality of gate electrodes ECL, GSL, WL1 to WLn, and SSL.

The upper surfaces of each of the plurality of cell contacts CCT may be disposed on the same plane. Further, the bottom surfaces of each of the plurality of cell contacts CCT may be disposed together on the same plane. However, the technical idea of the present disclosure is not limited thereto.

A plurality of metal patterns 170 may be disposed on the substrate 100 in the extension region EXT. The plurality of metal patterns 170 may be disposed on the mold structure MS in the extension region EXT. The upper surfaces of the plurality of metal patterns 170 may be disposed on the same plane as the upper surfaces of the bit lines BL. The plurality of metal patterns 170 may be electrically connected to each of the plurality of cell contacts CCT. For example, a via contact 163 may be formed between each of the plurality of metal patterns 170 and each cell contact CCT. The plurality of metal patterns 170 and each cell contact CCT may be electrically connected through the via contact 163.

The plurality of metal patterns 170 may include a conductive material. For example, the plurality of metal patterns 170 may include, but are not limited to, tungsten (W) or copper (Cu).

In some embodiments, the peripheral circuit structure PERI may include a peripheral circuit board 200 and a peripheral circuit element PT.

The peripheral circuit board 200 may be disposed below the substrate 100. For example, the upper surface of the peripheral circuit board 200 may face the lower surface of the substrate 100. The peripheral circuit board 200 may include, for example, a semiconductor substrate such as a silicon substrate, a germanium substrate or a silicon-germanium substrate. In some embodiments, the peripheral circuit board 200 may include a silicon-on-insulator (SOI) substrate or a germanium-on-insulator (GOI) substrate.

The peripheral circuit element PT may be formed on (or in) the peripheral circuit board 200. The peripheral circuit element PT may constitute a peripheral circuit (e.g., 30 of FIG. 1) that controls the operation of the semiconductor memory device. For example, the peripheral circuit element PT may include a control logic (e.g., 37 of FIG. 1), a row decoder (e.g., 33 of FIG. 1), a page buffer (e.g., 35 of FIG. 1), and the like. In the following description, a surface of the peripheral circuit board 200 on which the peripheral circuit elements PT are disposed may be referred to as a front side of the peripheral circuit board 200. In contrast, a surface of the peripheral circuit board 200 opposite to the front side of the peripheral circuit board 200 may be referred to as a back side of the peripheral circuit board 200.

The peripheral circuit element PT may include, for example, but is not limited to, a transistor. For example, the peripheral circuit element PT may include not only various active elements such as a transistor, but also various passive elements such as a capacitor, a resistor, and an inductor.

In some embodiments, a back side of the substrate 100 may face the front side of the peripheral circuit board 200. For example, an inter-wiring insulating film 220 that covers at least a portion of the peripheral circuit element PT may be formed on the front side of the peripheral circuit board 200. The substrate 100 may be stacked on the upper surface of the inter-wiring insulating film 220.

The peripheral circuit elements PT may be separated from each other by a peripheral element isolation film 205. For example, the peripheral element isolation film 205 may be provided inside the peripheral circuit board 200. The peripheral element isolation film 205 may be a shallow trench isolation (STI) film, but is not limited thereto. The peripheral element isolation film 205 may define an active region of the peripheral circuit elements PT. The peripheral element isolation film 205 may include an insulating material. The peripheral element isolation film 205 may include, for example, silicon nitride, silicon oxide, and/or silicon oxynitride.

The peripheral circuit structure PERI may further include a plurality of wiring patterns 232 and a plurality of wiring contacts 231. The plurality of wiring patterns 232 and the plurality of wiring contacts 231 may be electrically connected to each other. The plurality of wiring patterns 232 and the plurality of wiring contacts 231 may electrically connect the peripheral circuit element PT and other components in the cell structure CELL. Each of the plurality of wiring patterns 232 and the plurality of wiring contacts 231 may include a conductive material. For example, each of the plurality of wiring patterns 232 and the plurality of wiring contacts 231 may include, but are not limited to, tungsten (W) or copper (Cu).

Some embodiments of the semiconductor memory device of the present disclosure will be described below with reference to FIGS. 11 to 17. For convenience of explanation, points different from those explained using FIGS. 3 to 10 will be mainly explained.

Figure 11:
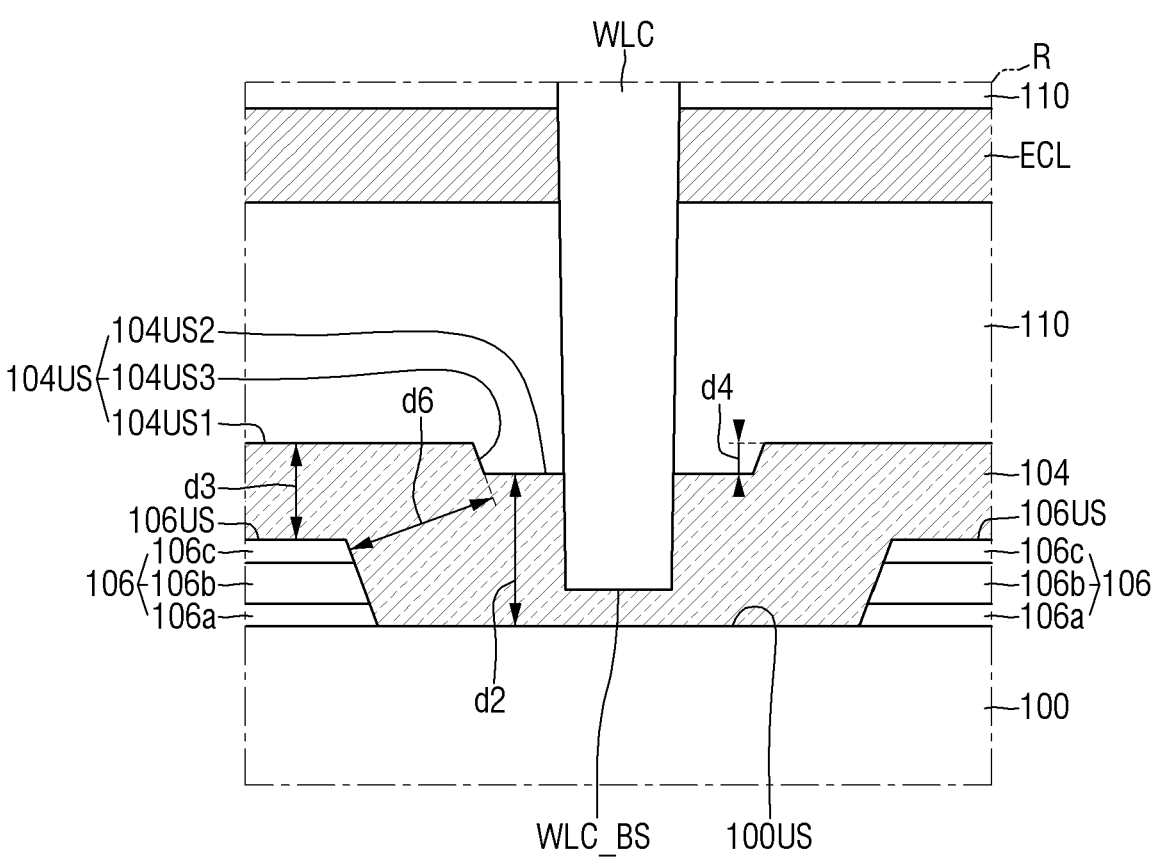
FIG. 11 is an enlarged view of a region R of FIG. 9 according to some embodiments.
Figure 12:
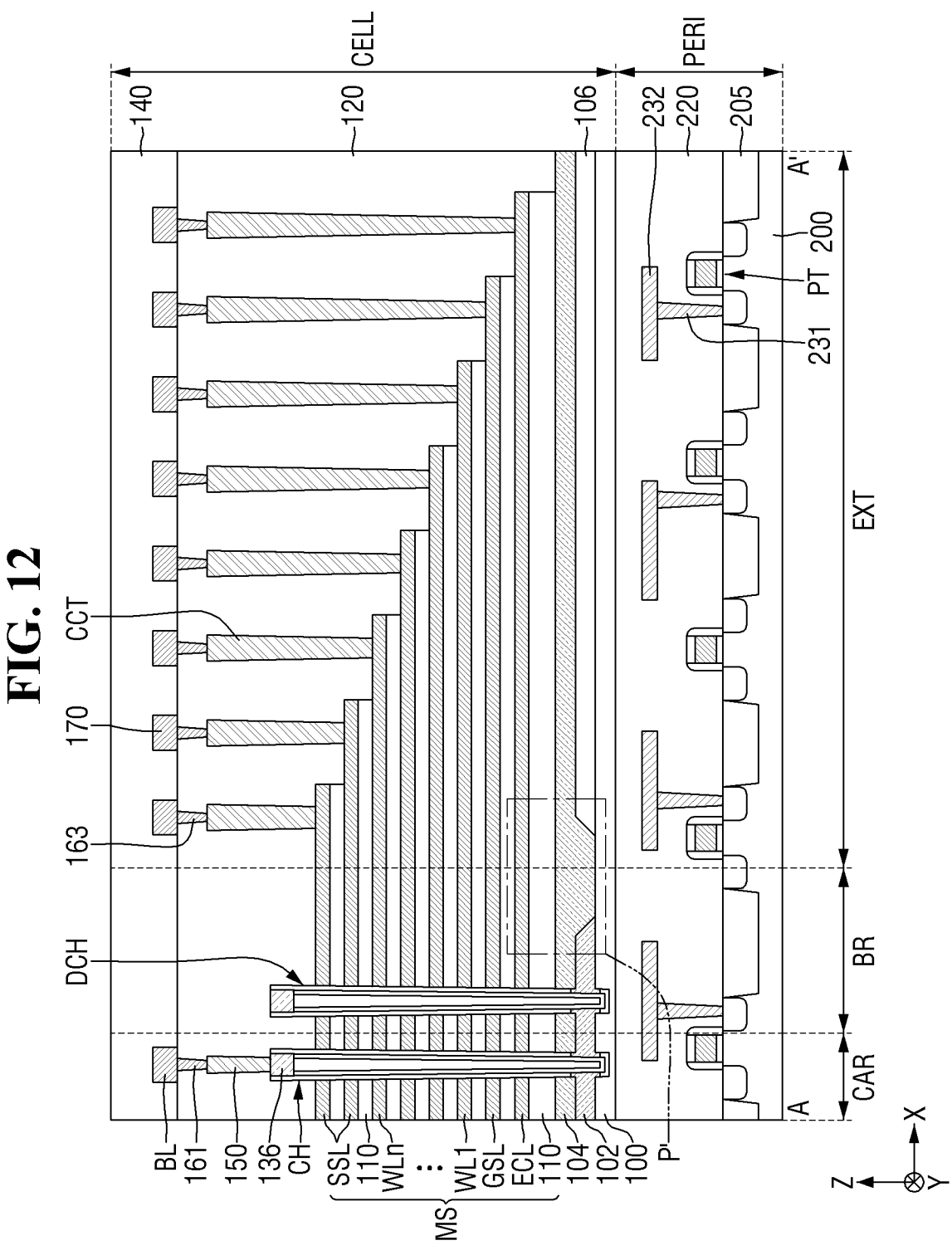
FIG. 12 is an example cross-sectional view taken along line A-A' of FIG. 3 according to some embodiments.
Figure 13:
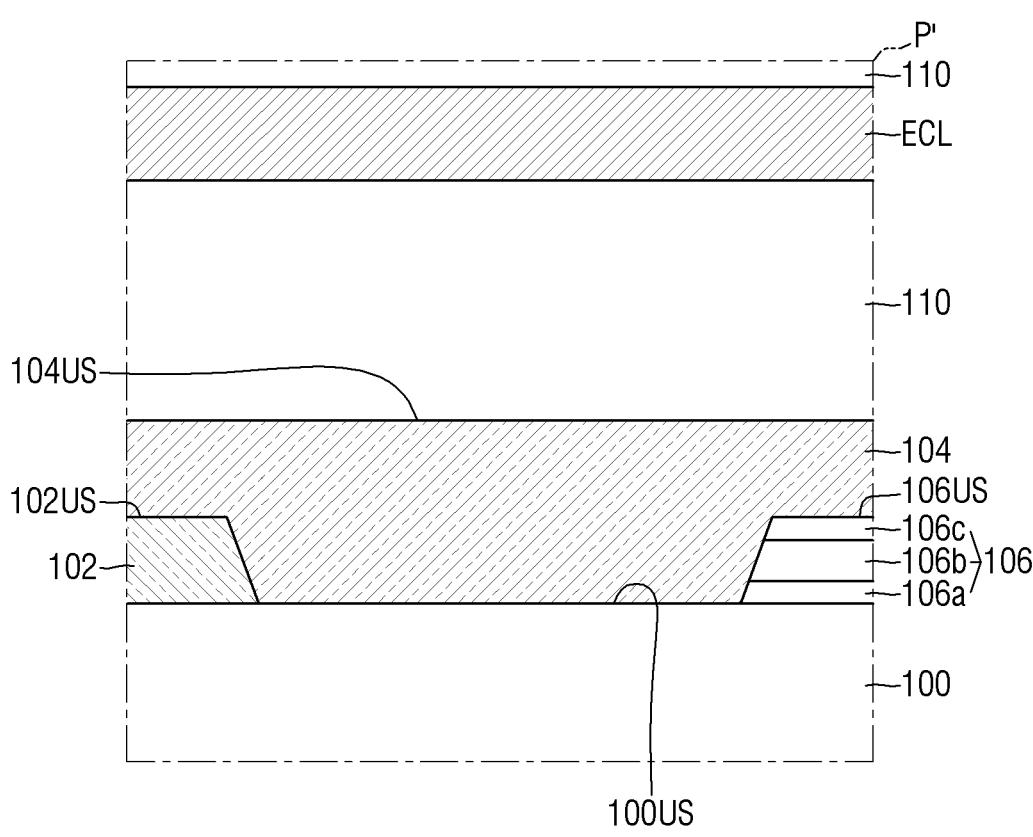
FIG. 13 is an enlarged view of a region P' of FIG. 12 according to some embodiments.
Figure 14:
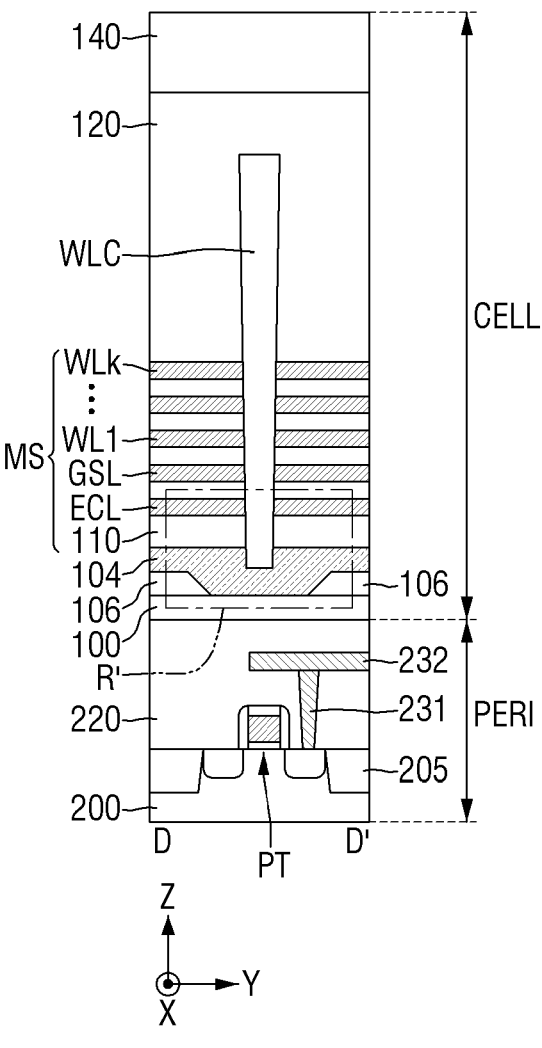
FIG. 14 is an example cross-sectional view taken along line D-D' of FIG. 3 according to some embodiments.
Figure 15:
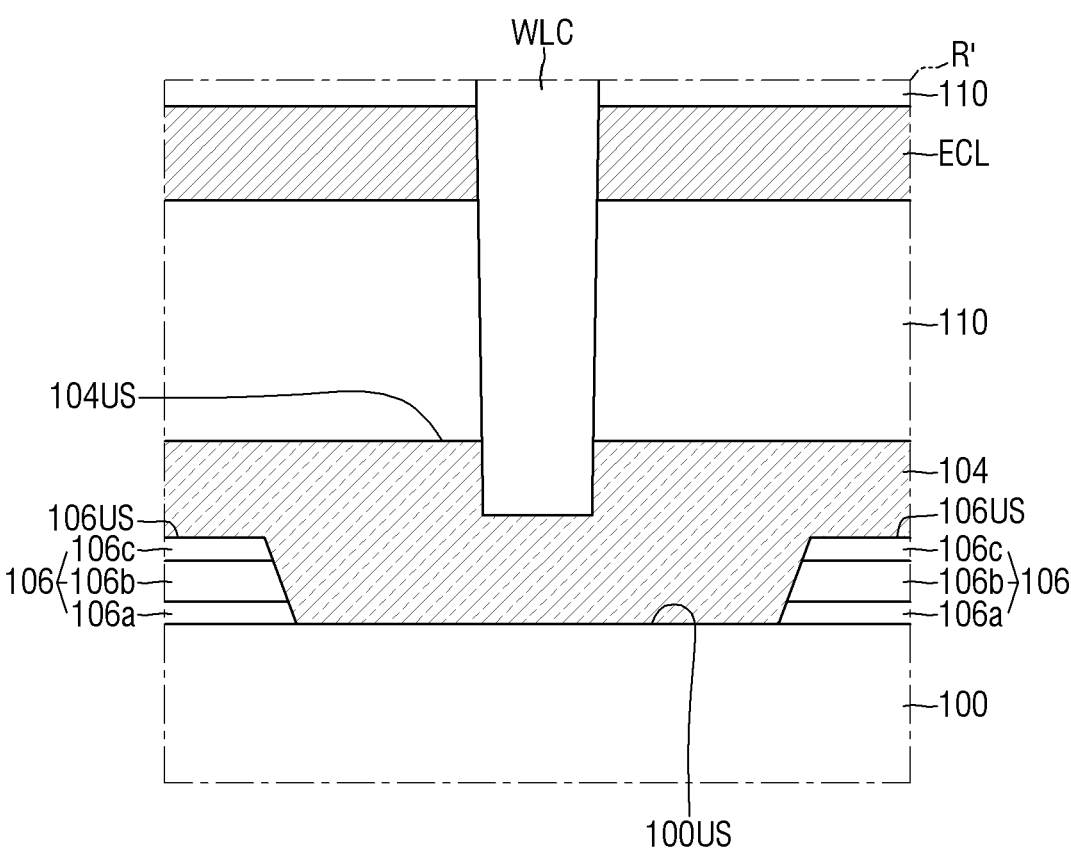
FIG. 15 is an enlarged view of a region R' of FIG. 14 according to some embodiments.

FIGS. 11 to 15 are example diagrams for explaining a semiconductor memory device according to some embodiments. For reference, FIG. 11 is an enlarged view of a region R of FIG. 9 according to some embodiments. FIG. 12 is an example cross-sectional view taken along line A-A' of FIG. 3 according to some embodiments, and FIG. 13 is an enlarged view of a region P' of FIG. 12 according to some embodiments. FIG. 14 is an example cross-sectional view taken along line D-D' of FIG. 3 according to some embodiments, and FIG. 15 is an enlarged view of a region R' of FIG. 14 according to some embodiments.

Referring to FIG. 11, a vertical level of a bottom surface WLC_BS of the word line cutting structure WLC on the substrate 100 in the extension region EXT may be lower than a vertical level of the upper surface 106US (e.g., upper surface of the third layer 106*c* or uppermost surface of the upper surface 106US) of the source sacrificial layer 106.

That is, a vertical distance in the third direction Z from the upper surface 100US of the substrate 100 to the bottom surface WLC_BS of the word line cutting structure WLC on the substrate 100 in the extension region EXT may be smaller than a vertical distance in the third direction Z from the upper surface 100US of the substrate 100 to the upper surface 106US of the source sacrificial layer 106. However, the technical idea of the present disclosure is not limited thereto.

A part of the word line cutting structure WLC on the substrate 100 in the extension region EXT may overlap the source sacrificial layer 106 in the second direction Y. However, the technical idea of the present disclosure is not limited thereto.

Referring to FIGS. 12 to 15, the upper surface 104US of the source support layer 104 may not have various distances in the third direction Z from the upper surface 100US of the substrate 100. A vertical level of the upper surface 104US of the source support layer 104 may be constant (e.g., uniform) from the cell array region CAR toward the extension region EXT. That is, the first to third portions (104US1, 104US2, and 104US3 of FIG. 5) of the upper surface 104US of the source support layer 104 may all be disposed on the same plane.

In some embodiments, a pre-source support layer (104_*p* of FIG. 23) may be formed, and the pre-source support layer may be partially removed through a chemical mechanical polishing (CMP) process. The pre-source support layer may be partially removed to form the source support layer 104. In some embodiments, when the pre-source support layer is substantially removed, the upper surface 104US of the source support layer 104 may not have various distances in the third direction Z from the upper surface 100US of the substrate 100. For example, the upper surface 104US of the source support layer 104 may have a uniform distance from the upper surface 100US of the substrate 100.

Figure 16:
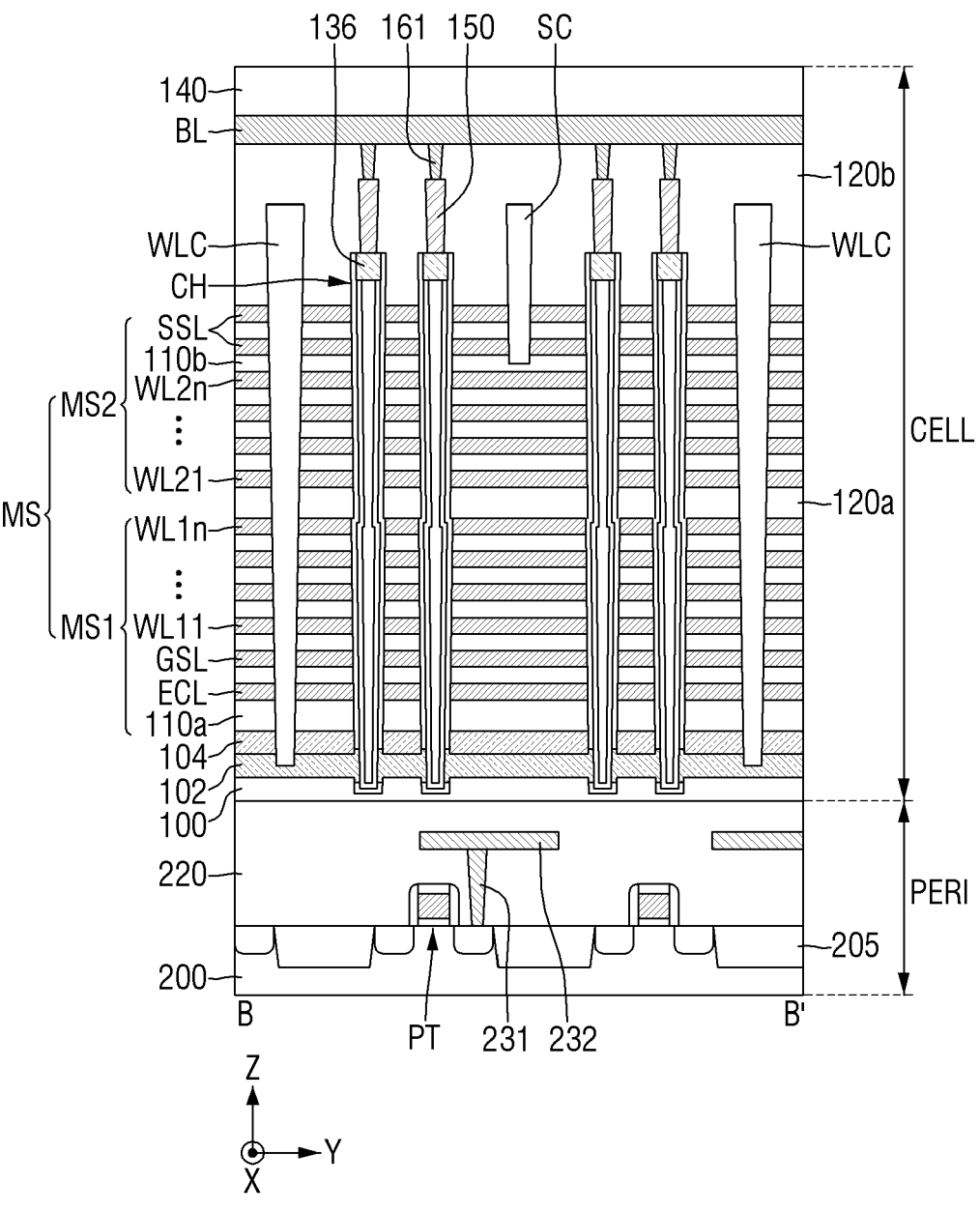
FIG. 16 is an example cross-sectional view taken along line B-B' of FIG. 3 according to some embodiments.

FIG. 16 is an example cross-sectional view taken along line B-B' of FIG. 3 according to some embodiments.

Referring to FIG. 16, a semiconductor memory device according to some embodiments may be a two-stack (2 stack) semiconductor memory device. For example, the mold structure MS may include a lower mold structure MS1 and an upper mold structure MS2. The upper mold structure MS2 may be disposed on the lower mold structure MS1.

The lower mold structure MS1 may include a plurality of lower gate electrodes ECL, GSL, and WL11 to WL1*n* and a plurality of lower mold insulating films 110*a* which are alternately stacked on the substrate 100. The plurality of lower gate electrodes ECL, GSL, and WL11 to WL1*n* and the plurality of lower mold insulating films 110*a* may have a layered structure extending parallel to the upper surface (e.g., 100US) of the substrate 100. The lower gate electrodes ECL, GSL, and WL11 to WL1*n* may be stacked in a stepwise (stair shape) form in the extension region EXT. For example, the lower gate electrodes ECL, GSL, and WL11 to WL1*n* may extend in different lengths in the first direction X and have step profiles in a cross-sectional view. In some embodiments, the lower gate electrodes ECL, GSL, and WL11 to WL1*n* may extend in different lengths in the second direction Y and have step profiles in a cross-sectional view. The step profile may mean that the lower gate electrodes ECL, GSL, and WL11 to WL1*n* may have a smaller size as a distance in the third direction Z from the upper surface 100US of the substrate 100 increases. For example, in a plan view, the lower gate electrodes ECL, GSL, and WL11 to WL1*n* may have a smaller length in the first direction X and/or in the second direction Y as the distance in the third direction Z from the upper surface 100US of the substrate 100 increases.

The upper mold structure MS2 may include a plurality of upper gate electrodes WL21 to WL2*n* and SSL, and a plurality of upper mold insulating films 110*b* which are alternately stacked on the lower mold structure MS1. The plurality of upper gate electrodes WL21 to WL2$n$ and SSL, and the plurality of upper mold insulating films 110$b$ may have a layered structure extending parallel to the upper surface of the substrate 100. The upper gate electrodes WL21 to WL2$n$ and SSL may be stacked in a stepwise (stair shape) form in the extension region EXT. For example, the upper gate electrodes WL21 to WL2$n$ and SSL may extend in different lengths in the first direction X and have step profiles in a cross-sectional view. In some embodiments, the upper gate electrodes WL21 to WL2$n$ and SSL may extend in different lengths in the second direction Y and have step profiles in a cross-sectional view. The step profile may mean that the upper gate electrodes WL21 to WL2$n$ and SSL may have a smaller size as a distance in the third direction Z from the upper surface 100US of the substrate 100 increases. For example, in a plan view, the upper gate electrodes WL21 to WL2$n$ and SSL may have a smaller length in the first direction X and/or in the second direction Y as the distance in the third direction Z from the upper surface 100US of the substrate 100 increases.

In some embodiments, the first interlayer insulating film 120 may include a lower interlayer insulating film 120$a$ and an upper interlayer insulating film 120$b$. The upper interlayer insulating film 120$b$ may be disposed on the lower interlayer insulating film 120$a$. Each of the lower interlayer insulating film 120$a$ and the upper interlayer insulating film 120$b$ may include, for example, but is not limited to, silicon oxide, silicon oxynitride, and/or a low-k material having a lower dielectric constant than silicon oxide.

Figure 17:
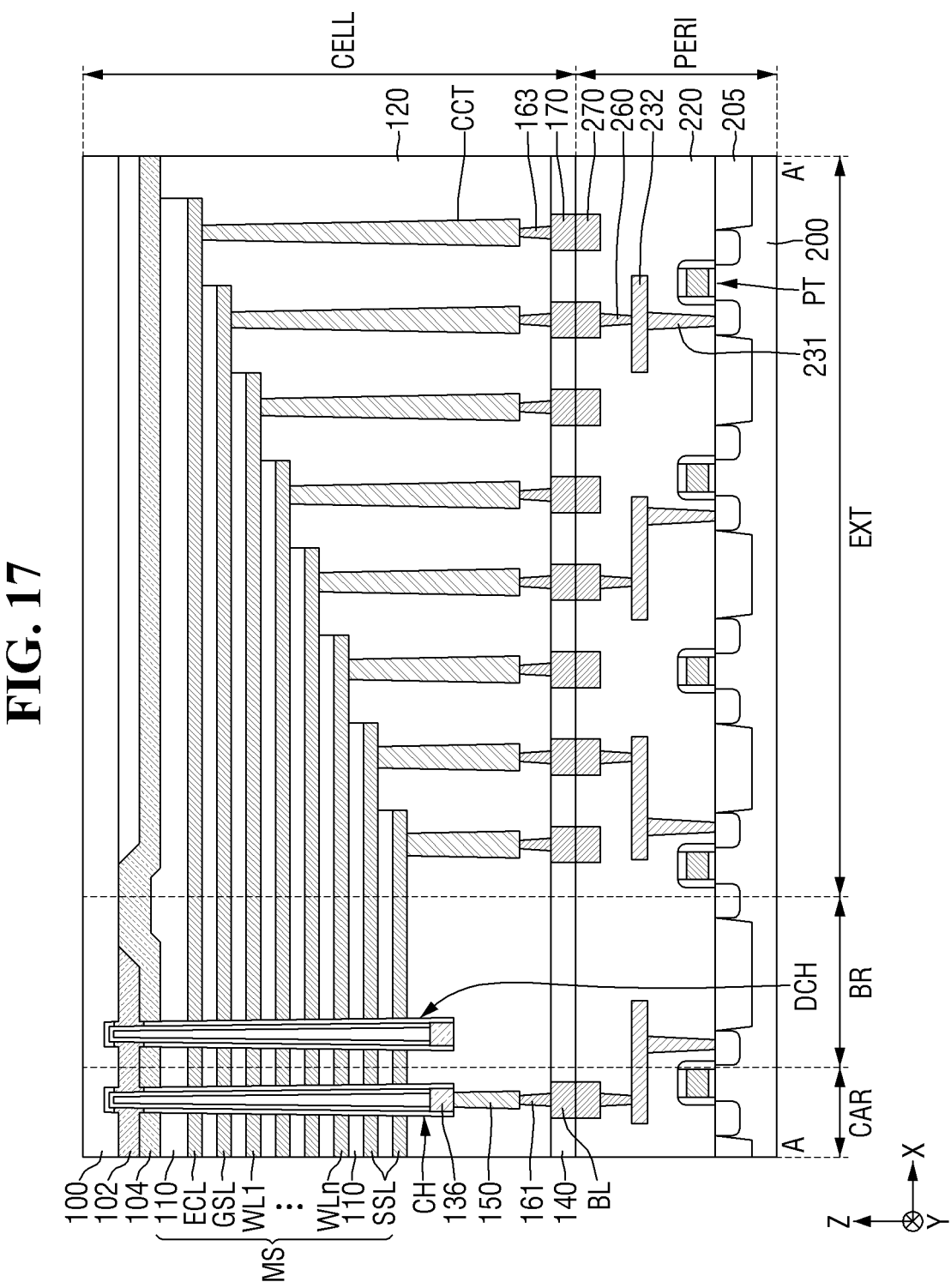
FIG. 17 is an example cross-sectional view taken along line A-A' of FIG. 3 according to some embodiments.

FIG. 17 is an example cross-sectional view taken along line A-A' of FIG. 3 according to some embodiments.

Referring to FIG. 17, in a semiconductor memory device according to some embodiments, the front side of the substrate 100 may face the front side of peripheral circuit board 200.

For example, a semiconductor memory device according to some embodiments may have a C2C (chip to chip) structure. The C2C structure may mean a structure in which an upper chip including the cell structure CELL is manufactured on a first wafer (e.g., the substrate 100) and a lower chip including the peripheral circuit region PERI is manufactured on a second wafer (e.g., the peripheral circuit board 200) different from the first wafer, and then, the upper chip and the lower chip are connected to each other by a bonding method.

As an example, the bonding method may mean a method of electrically connecting the bit lines BL and the plurality of metal patterns 170 formed on the uppermost metal layer of the upper chip, and the bonding metal 270 formed on the uppermost metal layer of the lower chip. For example, when the bit line BL, the plurality of metal patterns 170, and the bonding metal 270 are formed of copper (Cu), the bonding method may be a Cu—Cu bonding method. However, this is example only, and each of the bit lines BL, the plurality of metal patterns 170, and the bonding metal 270 may be formed of various other metals such as aluminum (Al) or tungsten (W).

As the bit line BL and the bonding metal 270 are electrically connected, and the plurality of metal patterns 170 and the bonding metal 270 are electrically connected, the cell structure CELL and the peripheral circuit structure PERI may be electrically connected. For example, the bit line BL and the wiring pattern 232 may be electrically connected to each other through the bonding metal 270, and the plurality of metal patterns 170 and the wiring pattern 232 may be electrically connected to each other through the bonding contact 260. Therefore, each of the gate electrode ECL, GSL, WL1 to WLn, and SSL and/or the source layer 102 may be electrically connected to the peripheral circuit element PT.

A method for fabricating a semiconductor memory device according to some embodiments will be described below with reference to FIGS. 18 to 26. FIGS. 18 to 26 are example diagrams sequentially showing processes of fabricating the semiconductor memory device having the cross section (or similar cross section) of FIGS. 4 and 5. For reference, FIGS. 19 to 26 are enlarged views of a region P of FIG. 18.

Figure 18:
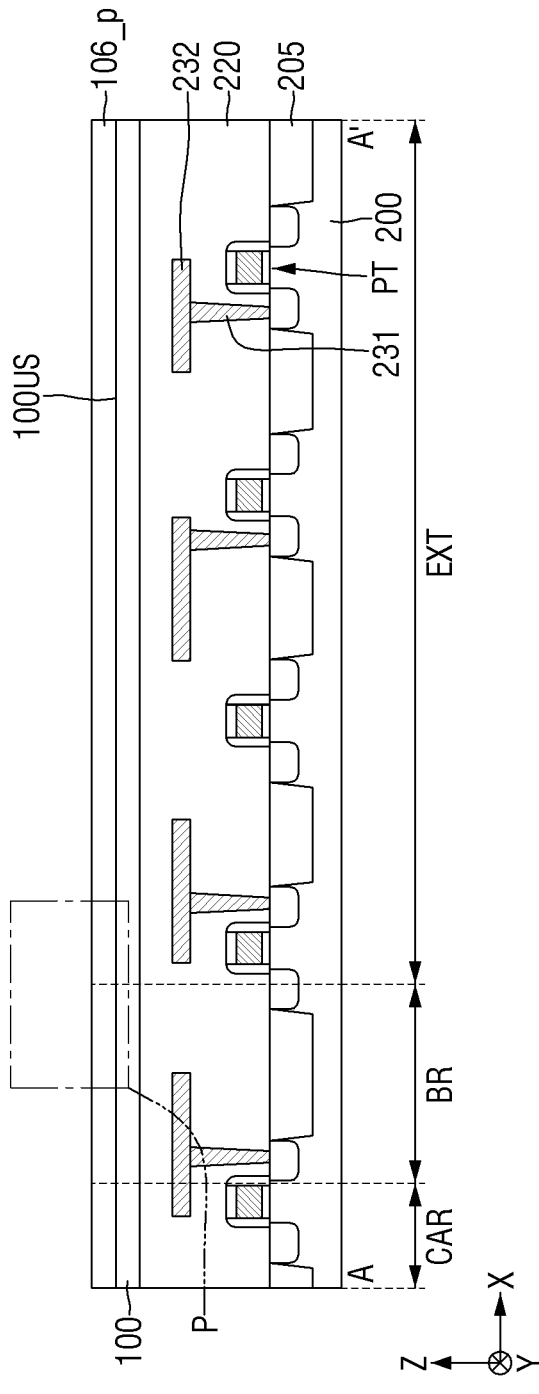
FIGS. 18 to 26 are example diagrams sequentially showing processes of fabricating the semiconductor memory device having the cross section of FIGS. 4 and 5.
Figure 19:
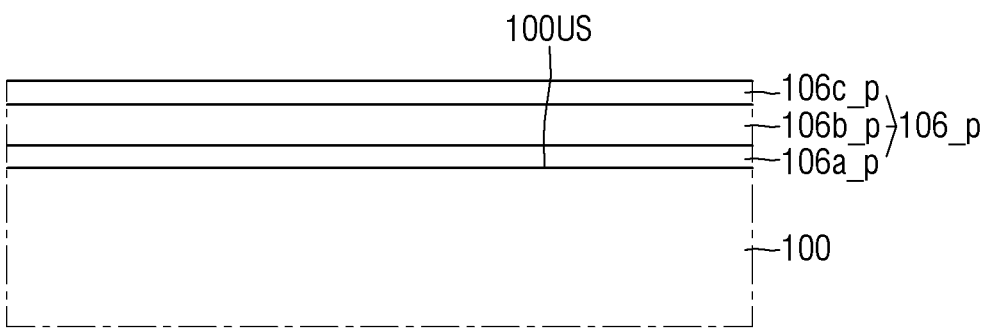

Referring to FIGS. 18 and 19, a peripheral circuit board 200 may be provided. A peripheral element isolation film 205 may be formed in the peripheral circuit board 200. The peripheral element isolation film 205 may define a source/drain region inside the peripheral circuit board 200.

In some embodiments, a peripheral circuit element PT, a plurality of wiring contacts 231 and a plurality of wiring patterns 232 may be formed on and/or in the peripheral circuit board 200. An inter-wiring insulating film 220 may be formed on (e.g., cover) the peripheral circuit element PT, the plurality of wiring contacts 231, and the plurality of wiring patterns 232.

The substrate 100 may be provided on the inter-wiring insulating film 220. A pre-source sacrificial layer 106_$p$ may be formed on the upper surface 100US of the substrate 100. The pre-source sacrificial layer 106_$p$ may include multiple-films. For example, the pre-source sacrificial layer 106_$p$ may include a pre-first layer 106$a$_p, a pre-second layer 106$b$_p, and a pre-third layer 106$c$_p. The pre-first layer 106$a$_p may be in contact with the upper surface 100US of the substrate 100. The pre-second layer 106$b$_p may be formed on the pre-first layer 106$a$_p. The pre-third layer 106$c$_p may be formed on the pre-second layer 106$b$_p. The embodiments of the pre-source sacrificial layer 106_$p$ is not limited thereto.

In some embodiments, the pre-first layer 106$a$_p and the pre-third layer 106$c$_p may be formed of the same material. For example, the pre-first layer 106$a$_p and the pre-third layer 106$c$_p may each be formed of a silicon oxide film. The pre-second layer 106$b$_p may be formed of a material different from the pre-first layer 106$a$_p and the pre-third layer 106$c$_p. For example, the pre-second layer 106$b$_p may be formed of a silicon oxide film. However, the technical idea of the present disclosure is not limited thereto. The pre-second layer 106$b$_p may have an etch selectivity with the pre-first layer 106$a$_p and the pre-third layer 106$c$_p.

Figure 20:
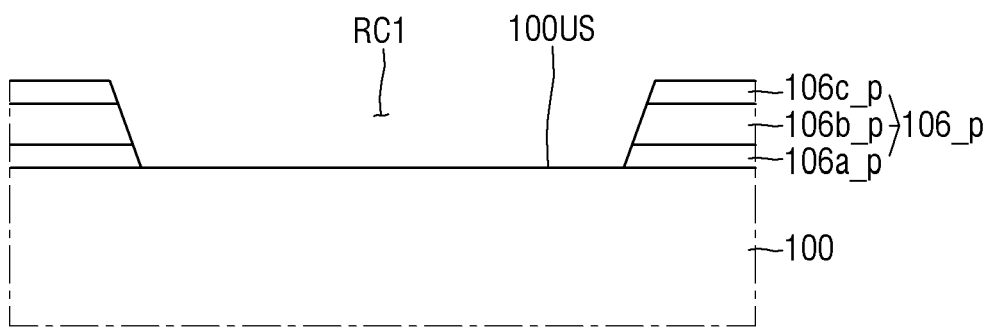

Referring to FIG. 20, a part of the pre-source sacrificial layer 106$p$ may be etched to form a first recess RC1. The pre-source sacrificial layer 106$p$ may be etched to expose a portion of the upper surface 100US of the substrate 100. The first recess RC1 may be a portion on which a word line cutting structure WLC, which will be formed below, lands.

Figure 21:
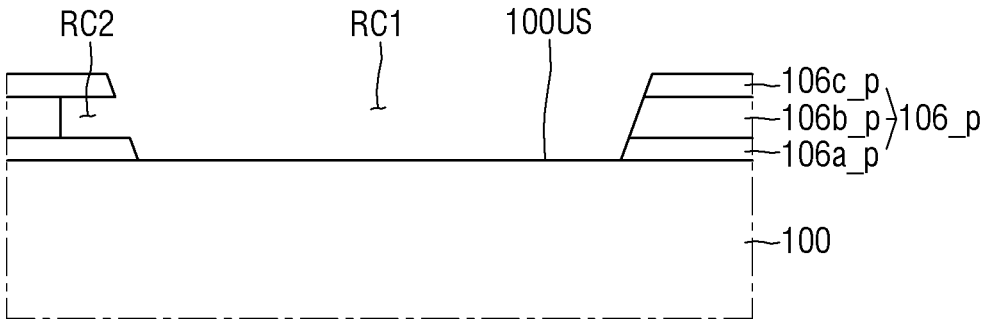

Referring to FIG. 21, a part of the pre-second layer 106$b$_p of the pre-source sacrificial layer 106_$p$ may be etched to form a second recess RC2. The pre-second layer 106$b$_p of the pre-source sacrificial layer 106_$p$ may be partially removed through a wet etching process. The pre-second layer 106$b$_p may have an etch selectivity with the pre-first layer 106$a$_p and the pre-third layer 106$c$_p. Therefore, the pre-first layer 106$a$_p and the pre-third layer 106$c$_p may not be removed, while the pre-second layer 106$b$_p is partially removed. The pre-second layer 106$b$_p may be selectively removed.

Figure 22:
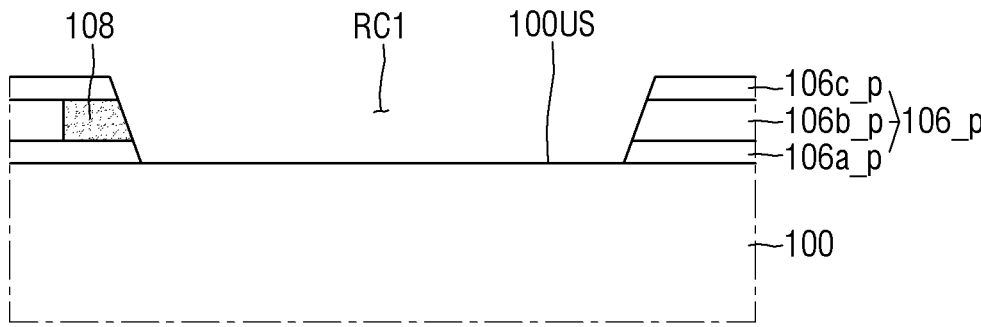

Referring to FIG. 22, a sacrificial insulating film 108 may be formed. The sacrificial insulating film 108 may fill the second recess RC2. The sacrificial insulating film 108 may include an oxide-based insulating material. The sacrificial insulating film 108 may be formed of, for example, but is not limited to, a silicon oxide film.

Figure 23:
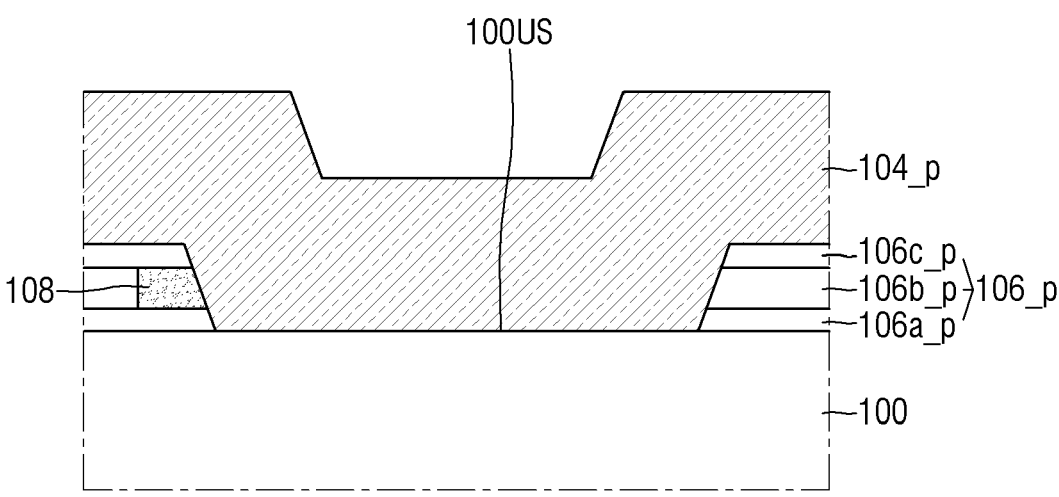

Referring to FIG. 23, a pre-source support layer 104_p may be formed on the substrate 100. The pre-source support layer 104_p may cover the upper surface of the pre-source sacrificial layer 106_p. A part of the pre-source support layer 104_p may be in contact with the upper surface 100US of the substrate 100.

The pre-source support layer 104_p may be conformally (e.g., uniformly) formed. The pre-source support layer 104_p may have a constant thickness in the third direction Z. For example, the thickness of the pre-source support layer 104_p in the third direction Z may be, but is not limited to, about 1000 Å.

The pre-source support layer 104_p may be, for example, formed of a silicon film. For example, the pre-source support layer 104_p may be formed of, but is not limited to, a polysilicon film that is not doped with impurity.

Figure 24:
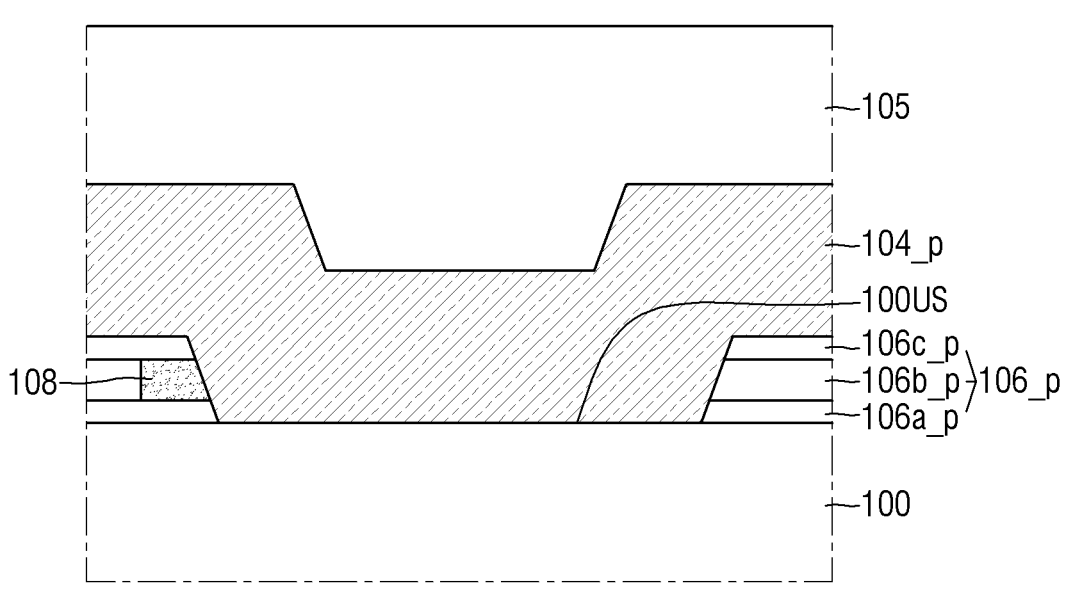

Referring to FIG. 24, a capping insulating film 105 may be formed on the pre-source support layer 104_p. The capping insulating film 105 may completely cover the pre-source support layer 104_p. The capping insulating film 105 may include, for example, an oxide-based insulating material. The capping insulating film 105 may include the same material as the first interlayer insulating film (120 of FIG. 4). For example, the capping insulating film 105 may include, but is not limited to, silicon oxide, silicon oxynitride, and/or a low dielectric constant (low-k) material having a lower dielectric constant than silicon oxide.

Figure 25:
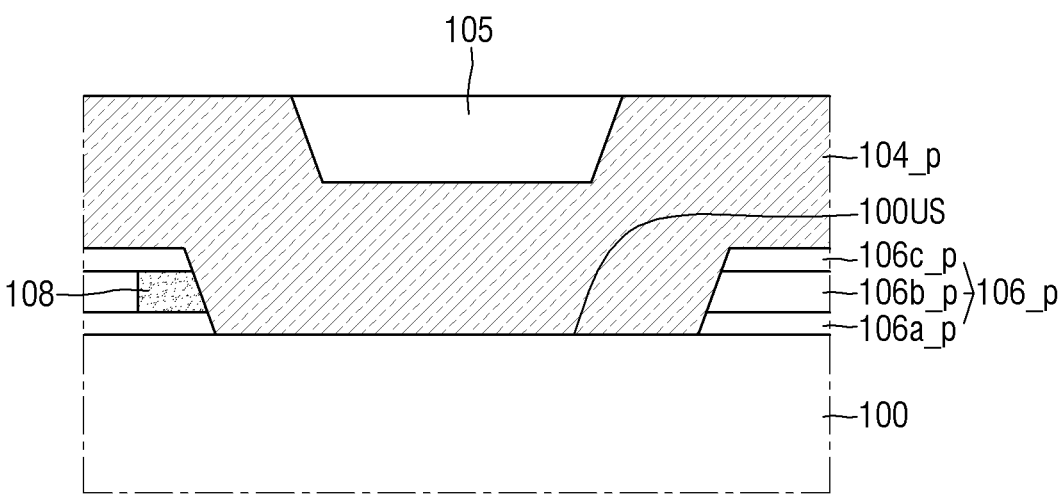

Referring to FIG. 25, a part of the capping insulating film 105 may be removed to expose the pre-source support layer 104_p. The capping insulating film 105 may be removed through a chemical mechanical polishing (CMP) process. When the pre-source support layer 104_p is exposed, while performing the CMP process to remove the capping insulating film 105, the CMP process may be interrupted (e.g., finished).

Figure 26:
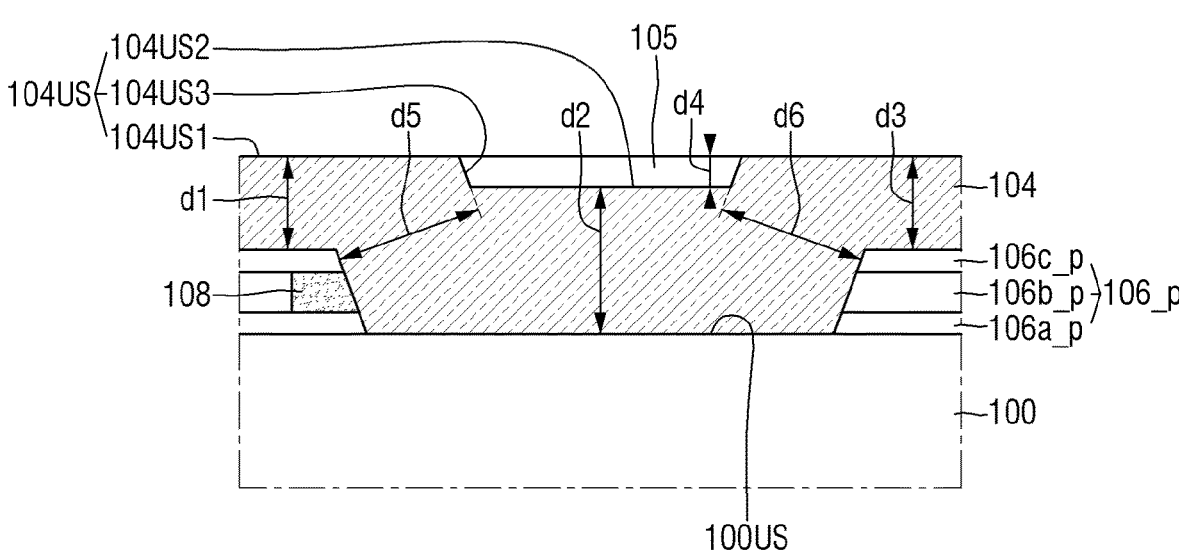

Referring to FIG. 26, a part of the pre-source support layer 104_p may be removed to form the source support layer 104. The pre-source support layer 104_p may be removed through a chemical mechanical polishing (CMP) process. While the pre-source support layer 104_p is being removed, a part of the capping insulating film 105 may also be removed. That is, the uppermost part of the upper surface 104US of the source support layer 104 may be disposed on the same plane as the upper surface of the capping insulating film 105. A lowermost part of the upper surface 104US of the source support layer 104 may be disposed on the same plane as the lower surface of the capping insulating film 105.

The upper surface 104US of the source support layer 104 may include a first portion 104US1, a second portion 104US2, and a third portion 104US3. The first portion 104US1 may be an uppermost part of the upper surface 104US of the source support layer 104. The second portion 104US2 may be a lowermost part of the upper surface 104US of the source support layer 104. The third portion 104US3 may connect the first portion 104US1 and the second portion 104US2.

The first portion 104US1 may be disposed on the same plane as the upper surface of the capping insulating film 105. The second portion 104US2 may be disposed on the same plane as the lower surface of the capping insulating film 105. The third portion 104US3 may be in contact with sidewalls of the capping insulating film 105.

Because the pre-source support layer 104_p is removed through the chemical mechanical polishing process, a fourth vertical distance d4 between a vertical level of the first portion 104US1 and a vertical level of the second portion 104US2 may be 50 Å or less. Since the fourth vertical distance d4 is 50 Å or less, the process margin of the process of forming the word line cutting structure WLC later can be improved.

Referring to FIGS. 4 and 5, the pre-source sacrificial layer 106_p located on some parts of the cell array region CAR and the boundary region BR may be removed. The source layer 102 may be formed in the region from which the pre-source sacrificial layer 106_p is removed.

An electronic system including the semiconductor memory device according to some embodiments will be described below with reference to FIGS. 1 to 10 and 27 to 29.

Figure 27:
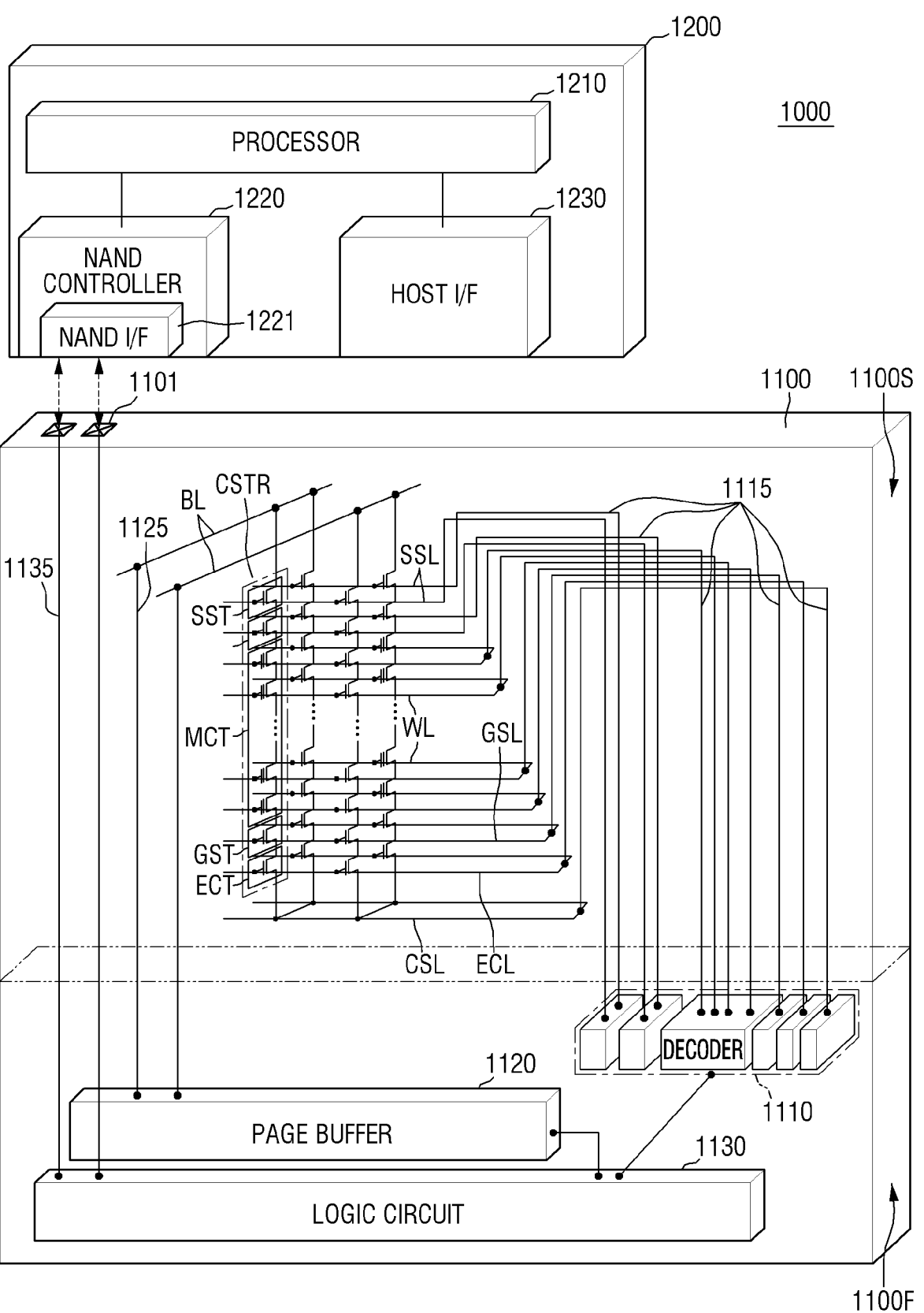
FIG. 27 is an example block diagram of an electronic system according to some embodiments.
Figure 28:
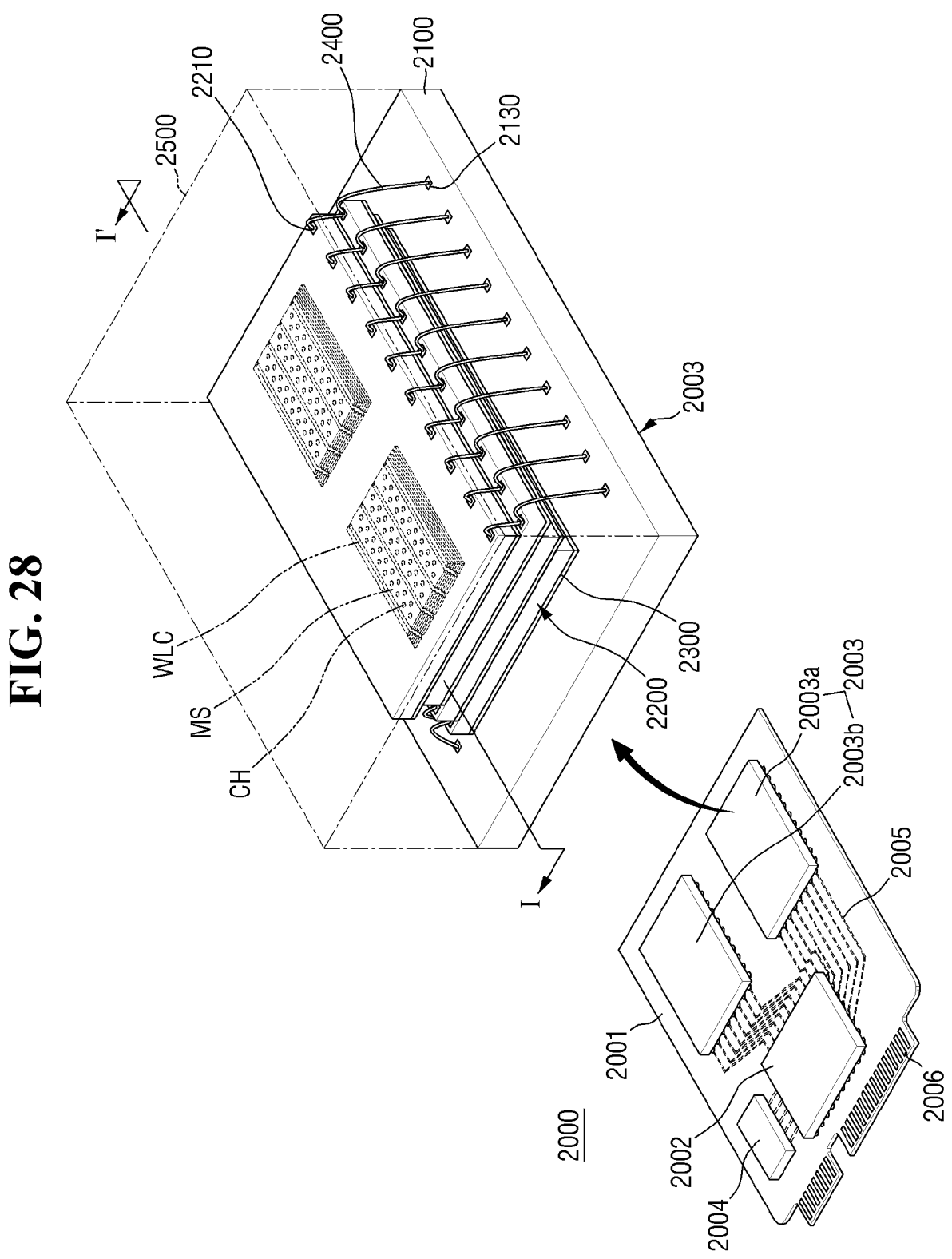
FIG. 28 is an example perspective view of an electronic system according to some embodiments.
Figure 29:
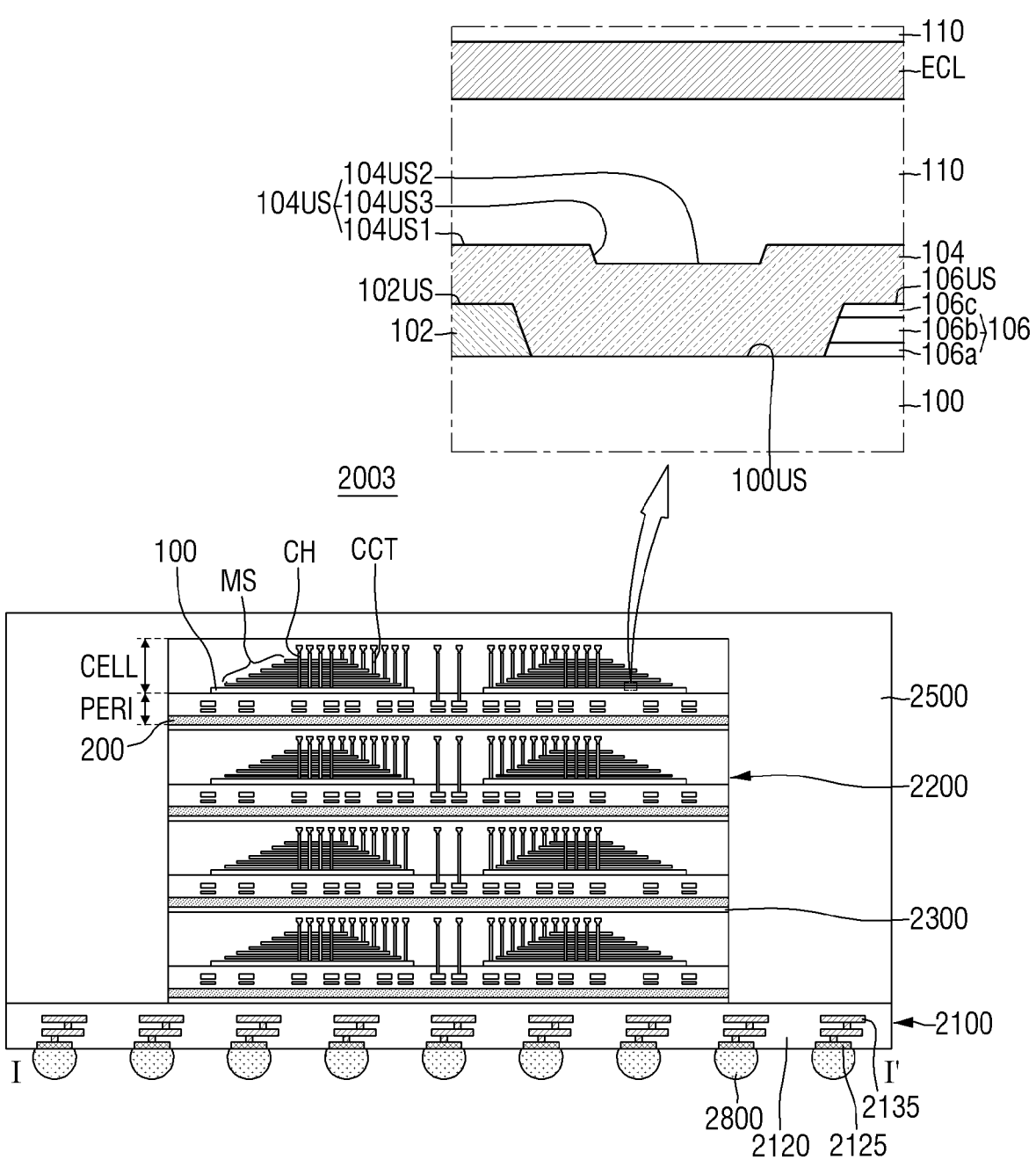
FIG. 29 is a schematic cross-sectional view taken along a line I-I' of FIG. 28.

FIG. 27 is an example block diagram of an electronic system according to some embodiments. FIG. 28 is an example perspective view of an electronic system according to some embodiments. FIG. 29 is a schematic cross-sectional view taken along a line I-I' of FIG. 28.

Referring to FIG. 27, an electronic system 1000 according to some embodiments may include a semiconductor memory device 1100, and a controller 1200 that is electrically connected to the semiconductor memory device 1100. The electronic system 1000 may be a storage device that includes one or multiple semiconductor memory devices 1100, or an electronic device that includes the storage device. For example, the electronic system 1000 may be an SSD device (solid state drive device), a USB (Universal Serial Bus), a computing system, a medical device or a communication device that includes one or multiple semiconductor memory devices 1100.

The semiconductor memory device 1100 may be for example, a NAND flash memory device, including the embodiments explained above using FIG. 1 to 10. The semiconductor memory device 1100 may include a first structure 1100F, and a second structure 1100S on the first structure 1100F.

The first structure 1100F may be a peripheral circuit structure including a decoder circuit 1110 (e.g., the row decoder 33 of FIG. 1), a page buffer 1120 (e.g., the page buffer 35 of FIG. 1), and a logic circuit 1130 (e.g., the control logic 37 of FIG. 1).

The second structure 1100S may include the common source line CSL, the plurality of bit lines BL, and the plurality of cell strings CSTR explained above using FIG. 2. The cell strings CSTR may be electrically connected to the decoder circuit 1110 through a word line WL, at least one string selection line SSL, and at least one ground selection line GSL. In addition, the cell strings CSTR may be electrically connected to the page buffer 1120 through the bit lines BL.

In some embodiments, the common source line CSL and the cell strings CSTR may be electrically connected to the decoder circuit 1110 through a first connecting wiring 1115 extending between the first structure 1100F and the second structure 1100S.

In some embodiments, the bit lines BL may be electrically connected to the page buffer 1120 through a second connecting wiring 1125 extending between the first structure 1100F and the second structure 1100S.

The semiconductor memory device 1100 may communicate with the controller 1200 through I/O pads 1101 electrically connected to the logic circuit 1130 (e.g., the control logic 37 of FIG. 1). The I/O pads 1101 may be electrically connected to the logic circuit 1130 through an I/O connecting wiring 1135 extending between the first structure 1100F and the second structure 1100S.

The controller 1200 may include a processor 1210, a NAND controller 1220, and a host interface 1230. In some embodiments, the electronic system 1000 may include a plurality of semiconductor memory devices 1100, and in this case, the controller 1200 may control the plurality of semiconductor memory devices 1100.

The processor 1210 may control the overall operations of the electronic system 1000 including the controller 1200. The processor 1210 may operate according to a predetermined firmware, and may control the NAND controller 1220 to access the semiconductor memory device 1100. The NAND controller 1220 may include a NAND interface 1221 that processes communication with the semiconductor memory device 1100. Control command for controlling the semiconductor memory device 1100, data to be recorded in the memory cell transistors MCT of the semiconductor memory device 1100, data to be read from the memory cell transistors MCT of the semiconductor memory device 1100, and the like may be transmitted through the NAND interface 1221. The host interface 1230 may provide a communication function between the electronic system 1000 and an external host. When receiving the control command from the external host through the host interface 1230, the processor 1210 may control the semiconductor memory device 1100 in response to the control command.

Referring to FIGS. 27 to 29, an electronic system 2000 according to some embodiments may include a main board 2001, a main controller 2002 mounted on the main board 2001, one or more semiconductor packages 2003, and a DRAM 2004. The semiconductor package 2003 and the DRAM 2004 may be electrically connected to the main controller 2002 by wiring patterns 2005 formed on the main board 2001.

The main board 2001 may include a connector 2006 including a plurality of fins coupled to an external host. In the connector 2006, the number and placement of the plurality of fins may vary depending on the communication interface between the electronic system 2000 and the external host. In some embodiments, the electronic system 2000 may communicate with the external host according to interfaces such as M-Phy for USB (Universal Serial Bus), PCI-Express (Peripheral Component Interconnect Express), SATA (Serial Advanced Technology Attachment), and UFS (Universal Flash Storage). In some embodiments, the electronic system 2000 may operate by power supplied from the external host through the connector 2006. The electronic system 2000 may further include a PMIC (Power Management Integrated Circuit) that distributes the power supplied from the external host to the main controller 2002 and the semiconductor package 2003.

The main controller 2002 may record data in the semiconductor package 2003 or read data from the semiconductor package 2003, and may improve the operating speed of the electronic system 2000.

The DRAM 2004 may be a buffer memory for relieving a speed difference between the semiconductor package 2003, which is a data storage space, and the external host. The DRAM 2004 included in the electronic system 2000 may also operate as a kind of cache memory, and may also provide a space for temporarily storing data in the control operation on the semiconductor package 2003. When the DRAM 2004 is included in the electronic system 2000, the main controller 2002 may further include a DRAM controller for controlling the DRAM 2004, in addition to a NAND controller for controlling the semiconductor package 2003.

The semiconductor package 2003 may include a first semiconductor package 2003a and a second semiconductor package 2003b that are spaced apart from each other. The first semiconductor package 2003a and the second semiconductor package 2003b may each be a semiconductor package that includes a plurality of semiconductor chips 2200. The first semiconductor package 2003a and the second semiconductor package 2003b may each include a package substrate 2100, semiconductor chips 2200 on the package substrate 2100, adhesive layers 2300 disposed on the lower surfaces of each of the semiconductor chips 2200, a connecting structure 2400 for electrically connecting the semiconductor chips 2200 and the package substrate 2100, and a molding layer 2500 that covers the semiconductor chips 2200 and the connecting structure 2400 on the package substrate 2100.

The package substrate 2100 may be a printed circuit board that includes package upper pads 2130. Each semiconductor chip 2200 may include an I/O pad 2210. The I/O pad 2210 may correspond to the I/O pad 1101 of FIG. 27.

In some embodiments, the connecting structure 2400 may be a bonding wire that electrically connects the I/O pad 2210 and the package upper pads 2130. Therefore, in each of the first semiconductor package 2003a and the second semiconductor package 2003b, the semiconductor chips 2200 may be electrically connected to each other by a bonding wire way, and may be electrically connected to the package upper pads 2130 of the package substrate 2100. In some embodiments, in each of the first semiconductor package 2003a and the second semiconductor package 2003b, the semiconductor chips 2200 may be electrically connected to each other by a connecting structure such as a through electrode (Through Silicon Via, TSV), instead of the connecting structure 2400 of the bonding wire.

In some embodiments, the main controller 2002 and the semiconductor chips 2200 may also be included in a single package. In some embodiments, the main controller 2002 and the semiconductor chips 2200 may be mounted on a separate interposer substrate different from the main board 2001, and the main controller 2002 and the semiconductor chips 2200 may also be electrically connected to each other by the wiring formed on the interposer substrate.

In some embodiments, the package substrate 2100 may be a printed circuit board. The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface, and inner wirings 2135 that electrically connect the package upper pads 2130 and the lower pads 2125 inside the package substrate body portion 2120. The package upper pads 2130 may be electrically connected to the connecting structure 2400. The lower pads 2125 may be electrically connected to the wiring patterns 2005 of the main board 2001 of the electronic system 2000 through conductive connections 2800, as in FIG. 28.

Referring to FIGS. 28 and 29, in the electronic system 2000 according to some embodiments, each of semiconductor chips 2200 may include the semiconductor memory device explained above using FIGS. 1 to 10. For example, each of the semiconductor chips 2200 may include a peripheral circuit structure PERI, and a cell structure CELL stacked on the peripheral circuit structure PERI. As an example, the peripheral circuit structure PERI may include the peripheral circuit board 200 and the peripheral circuit element PT explained above using FIGS. 3 to 10. Further, as an example, the cell structure CELL may include the substrate 100, the mold structure MS, the channel structure CH, the word line cutting structure WLC, the source layer 102, the source support layer 104, and the source sacrificial layer 106 explained above using FIGS. 3 to 10.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor memory device comprising:

a substrate, wherein the substrate includes a cell array region, an extension region, and a boundary region between the cell array region and the extension region;

a mold structure on the substrate, wherein the mold structure includes a plurality of gate electrodes stacked alternately with a plurality of mold insulating films, and wherein the plurality of gate electrodes includes a step profile in a cross-sectional view in the extension region;

a plurality of channel structures, wherein the plurality of channel structures extends in the mold structure in the cell array region;

a plurality of dummy channel structures, wherein the plurality of dummy channel structures extends in the mold structure in the boundary region;

a plurality of cell contacts electrically connected to the plurality of gate electrodes in the extension region;

a source layer between the substrate and the mold structure, wherein the source layer is electrically connected to the plurality of channel structures in the cell array region;

a source sacrificial layer between the substrate and the mold structure in the extension region, wherein the source sacrificial layer is spaced apart from the source layer; and a source support layer on the source layer and the source sacrificial layer, wherein the source support layer is between the source layer and the source sacrificial layer, wherein an upper surface of the source support layer includes a first portion extending parallel to an upper surface of the substrate, a second portion extending parallel to the upper surface of the substrate, and a third portion that connects the first portion and the second portion, wherein the first portion is spaced apart from the second portion, and wherein a first vertical distance from an upper surface of the source layer to the first portion is smaller than a second vertical distance from the upper surface of the substrate to the second portion.

2. The semiconductor memory device of claim 1, wherein each of the plurality of channel structures is in a respective channel hole, wherein each of the plurality of channel structures includes an information storage film on sidewalls and a bottom surface of the respective channel hole and a semiconductor pattern on the information storage film, and wherein the source layer extends in the information storage film and is electrically connected to the semiconductor pattern.

3. The semiconductor memory device of claim 1, wherein the first portion is farther than the second portion from the upper surface of the substrate.

4. The semiconductor memory device of claim 3, wherein a difference between a vertical distance from the upper surface of the substrate to the first portion and the second vertical distance is 50 angstroms (Å) or less.

5. The semiconductor memory device of claim 1, wherein the first portion is on a same plane as the second portion.

6. The semiconductor memory device of claim 1, wherein a third vertical distance from an upper surface of the source sacrificial layer to the first portion is smaller than the second vertical distance.

7. The semiconductor memory device of claim 6, wherein the first vertical distance and the third vertical distance are equal to each other.

8. The semiconductor memory device of claim 1, wherein a minimum distance from the source layer to a plane including the third portion is equal to the second vertical distance.

9. The semiconductor memory device of claim 1, wherein the mold structure comprises:

a lower structure, wherein the lower structure includes a plurality of lower gate electrodes and a plurality of lower mold insulating films that are alternately stacked on the substrate; and an upper structure, wherein the upper structure includes a plurality of upper gate electrodes and a plurality of upper mold insulating films that are alternately stacked on the lower structure.

10. The semiconductor memory device of claim 1, further comprising:

a plurality of word line cutting structures, wherein the plurality of word line cutting structures extends through the plurality of gate electrodes, wherein a distance in a vertical direction between a first bottom surface of the plurality of word line cutting structures in the cell array region and the upper surface of the substrate is different from a distance in the vertical direction between a second bottom surface of the plurality of word line cutting structures in the extension region and the upper surface of the substrate.

11. The semiconductor memory device of claim 10, wherein at least a portion of the plurality of word line cutting structures in the cell array region is in the source layer.

12. The semiconductor memory device of claim 10, wherein at least a portion of the plurality of word line cutting structures in the extension region is spaced apart from the source sacrificial layer.

13. The semiconductor memory device of claim 1, wherein at least a portion of the source support layer is in contact with the substrate.

14. A semiconductor memory device comprising:

a substrate, wherein the substrate includes a cell array region, an extension region, and a boundary region between the cell array region and the extension region;

a mold structure on the substrate, wherein the mold structure includes a plurality of gate electrodes stacked alternately with a plurality of mold insulating films, and wherein the plurality of gate electrodes includes a step profile in a cross-sectional view in the extension region;

a plurality of channel structures that extends in the mold structure in the cell array region, wherein each of the plurality of channel structures is in a respective channel hole that extends in the mold structure, and wherein each of the plurality of channel structures includes an information storage film on a sidewall and a bottom surface of the respective channel hole and a semiconductor pattern on the information storage film;

a plurality of dummy channel structures that extends in the mold structure in the boundary region;

a plurality of cell contacts electrically connected to the plurality of gate electrodes in the extension region;

a plurality of word line cutting structures that separates the plurality of gate electrodes;

a bit line that is electrically connected to each of the plurality of channel structures on the mold structure;

a source layer between the substrate and the mold structure, wherein the source layer extends in sidewalls of the information storage film and is electrically connected to the semiconductor pattern in the cell array region;

a source sacrificial layer between the substrate and the mold structure in the extension region, wherein the source sacrificial layer is spaced apart from the source layer; and a source support layer on the source layer and the source sacrificial layer, wherein the source support layer is between the source layer and the source sacrificial layer, wherein a first vertical distance from an upper surface of the source layer to an uppermost part of an upper surface of the source support layer is smaller than a second vertical distance from an upper surface of the substrate to a lowermost part of the upper surface of the source support layer, wherein a third vertical distance from an upper surface of the source sacrificial layer to the uppermost part of the upper surface of the source support layer is smaller than the second vertical distance, and wherein a first vertical level of a first bottom surface of the plurality of word line cutting structures in the cell array region is different from a second vertical level of a second bottom surface of the plurality of word line cutting structures in the extension region relative to the upper surface of the substrate.

15. The semiconductor memory device of claim 14, wherein at least a portion of the plurality of word line cutting structures in the cell array region is in the source layer.

16. The semiconductor memory device of claim 14, wherein at least a portion of the plurality of word line cutting structures in the extension region is spaced apart from the source sacrificial layer.

17. The semiconductor memory device of claim 14, wherein a vertical distance between a vertical level of the uppermost part of the upper surface of the source support layer and a vertical level of the lowermost part of the upper surface of the source support layer is 50 angstroms (Å) or less.

18. The semiconductor memory device of claim 14, wherein a minimum distance from the source layer to a plane including a portion that connects the uppermost part of the upper surface of the source support layer and lowermost part of the upper surface of the source support layer is equal to the second vertical distance.

19. The semiconductor memory device of claim 14, wherein the bit line is electrically insulated from the plurality of dummy channel structures.

20. An electronic system comprising:

a main board;

a semiconductor memory device on the main board; and a controller electrically connected to the semiconductor memory device, on the main board, wherein the semiconductor memory device comprises:

a substrate that includes a cell array region, an extension region, and a boundary region between the cell array region and the extension region;

a mold structure on the substrate, wherein the mold structure includes a plurality of gate electrodes stacked alternately with a plurality of insulating films, and wherein the plurality of gate electrodes includes a step profile in a cross-sectional view in the extension region;

a plurality of channel structures that extends in the mold structure in the cell array region;

a plurality of dummy channel structures that extends in the mold structure in the boundary region;

a plurality of cell contacts electrically connected to the plurality of gate electrodes in the extension region;

a source layer between the substrate and the mold structure, wherein the source layer is electrically connected to the plurality of channel structures in the cell array region;

a source sacrificial layer between the substrate and the mold structure in the extension region, wherein the source sacrificial layer is spaced apart from the source layer; and a source support layer on the source layer and the source sacrificial layer, wherein the source support layer is between the source layer and the source sacrificial layer, wherein an upper surface of the source support layer includes a first portion extending parallel to an upper surface of the substrate, a second portion extending parallel to the upper surface of the substrate, and a third portion that connects the first portion and the second portion, wherein the first portion is paced apart from the second portion, and wherein a first vertical distance from an upper surface of the source layer to the first portion is smaller than a second vertical distance from the upper surface of the substrate to the second portion.

* * * * *